United States Patent
Botti et al.

(10) Patent No.: US 10,763,803 B2
(45) Date of Patent: Sep. 1, 2020

(54) INTEGRATED CIRCUIT AND RELATED AUDIO AMPLIFIER

(71) Applicant: STMicroelectronics S.r.l., Agrate Brianza (IT)

(72) Inventors: Edoardo Botti, Vigevano (IT); Tommaso Barbieri, Milan (IT); Davide Luigi Brambilla, Segrate (IT); Cristiano Meroni, Milan (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 7 days.

(21) Appl. No.: 16/269,289

(22) Filed: Feb. 6, 2019

(65) Prior Publication Data
US 2019/0245498 A1    Aug. 8, 2019

(30) Foreign Application Priority Data

Feb. 7, 2018  (IT) .................. 102018000002466

(51) Int. Cl.
  *H03F 3/217*  (2006.01)
  *H03K 17/687*  (2006.01)
  (Continued)

(52) U.S. Cl.
  CPC ............ *H03F 3/217* (2013.01); *G05F 1/575* (2013.01); *H02M 3/00* (2013.01); *H02M 3/158* (2013.01);
  (Continued)

(58) Field of Classification Search
  CPC ....................................................... H03F 3/217
  (Continued)

(56) References Cited

U.S. PATENT DOCUMENTS 6,636,431 B2  10/2003  Seki et al.
7,199,563 B2   4/2007  Ikezawa
(Continued)

FOREIGN PATENT DOCUMENTS

CN    101662262 A    3/2010
CN    101826846 A    9/2010
(Continued)

OTHER PUBLICATIONS

Maxim Integrated, Application Note 3977, "Class D Amplifiers: Fundamentals of Operation and Recent Developments", Jan. 31, 2007, 12 pages.
(Continued)

*Primary Examiner* — Henry Choe
(74) *Attorney, Agent, or Firm* — Slater Matsil, LLP

(57) ABSTRACT

An integrated circuit includes a die that includes a circuit configured to generate a PWM signal in response to a first clock signal, and a first set of pads configured to provide amplified PWM signals to external filters. An amplifier stage is configured to provide the amplified PWM signals. The die includes two pads configured to be coupled to an external inductor, and a second set of pads configured to provide regulated voltages. An electronic converter circuit is configured to generate the regulated voltages to supply the amplifier stage. The electronic converter circuit includes a control circuit configured to drive electronic switches in response to a second clock signal to regulate the regulated voltages to a respective target value. The die includes a control block to synchronize the switching activity of the electronic switches with the switching activity of the amplifier stage.

20 Claims, 14 Drawing Sheets

Fig. 24

(51) Int. Cl.
  *H03K 3/017* (2006.01)
  *H04R 3/00* (2006.01)
  *G05F 1/575* (2006.01)
  *H03F 1/02* (2006.01)
  *H02M 3/158* (2006.01)
  *H02M 3/00* (2006.01)
  *H03F 3/187* (2006.01)
  *H02M 1/00* (2006.01)

(52) U.S. Cl.
  CPC ........... *H03F 1/0211* (2013.01); *H03F 3/187* (2013.01); *H03F 3/2173* (2013.01); *H03K 3/017* (2013.01); *H03K 17/687* (2013.01); *H04R 3/00* (2013.01); *H02M 2001/008* (2013.01); *H03F 2200/03* (2013.01); *H03F 2200/171* (2013.01); *H03F 2200/351* (2013.01); *H03K 2217/0063* (2013.01); *H03K 2217/0072* (2013.01)

(58) Field of Classification Search
  USPC .......................................... 330/251, 207 A, 10
  See application file for complete search history.

(56) References Cited

U.S. PATENT DOCUMENTS

| | | | |
|---|---|---|---|
| 7,262,658 B2 * | 8/2007 | Ramaswamy | H03F 1/30 330/10 |
| 7,990,215 B2 | 8/2011 | Soenen et al. | |
| 8,093,951 B1 | 1/2012 | Zhang et al. | |
| 8,237,417 B2 | 8/2012 | Miyamae | |
| 8,274,330 B2 * | 9/2012 | Paul | H01L 23/645 330/252 |
| 8,493,050 B2 | 7/2013 | Miyamae | |
| 8,558,618 B2 | 10/2013 | Nussbaum et al. | |
| 10,186,945 B1 | 1/2019 | Lidsky et al. | |
| 2008/0310046 A1 * | 12/2008 | Menegoli | G11B 21/02 360/75 |
| 2009/0135897 A1 | 5/2009 | Soma et al. | |
| 2009/0167259 A1 | 7/2009 | Miyamae | |
| 2009/0309658 A1 | 12/2009 | Mendenhall | |
| 2010/0134084 A1 | 6/2010 | Miyamae | |
| 2010/0225391 A1 | 9/2010 | Kim | |
| 2011/0127981 A1 | 6/2011 | Miyamae | |
| 2011/0175588 A1 | 7/2011 | Miyamae | |
| 2011/0273156 A1 | 11/2011 | Miyamae | |
| 2012/0081085 A1 | 4/2012 | Miyamae | |
| 2014/0056041 A1 | 2/2014 | Zhu et al. | |
| 2015/0145439 A1 | 5/2015 | Szolusha et al. | |
| 2015/0381044 A1 | 12/2015 | Bodano et al. | |
| 2016/0261185 A1 | 9/2016 | Lidsky et al. | |
| 2016/0329868 A1 | 11/2016 | Liu et al. | |
| 2017/0093348 A1 * | 3/2017 | Du | H03F 3/2171 |
| 2017/0110971 A1 | 4/2017 | Degen et al. | |
| 2017/0149403 A1 | 5/2017 | Cho et al. | |
| 2017/0331374 A1 | 11/2017 | Hoyerby | |
| 2019/0207505 A1 | 7/2019 | Ramadass et al. | |
| 2019/0245498 A1 | 8/2019 | Botti et al. | |

FOREIGN PATENT DOCUMENTS

| | | |
|---|---|---|
| CN | 102124647 A | 7/2011 |
| CN | 106169867 A | 11/2016 |
| CN | 106208991 A | 12/2016 |
| CN | 106602879 A | 4/2017 |
| CN | 107112892 A | 8/2017 |
| CN | 209593735 U | 11/2019 |
| JP | 2014093863 A | 5/2014 |
| JP | 2014166092 A | 9/2014 |

OTHER PUBLICATIONS

Huang, M.-H. et al., "Single-Inductor Multi-Output (SIMO) DC-DC Converters With High Light-Load Efficiency and Minimized Cross-Regulation for Portable Devices", IEEE Journal of Solid-State Circuits, vol. 44, No. 4, Apr. 2009, pp. 1099-1111.
Chen, et al., "Embedded Single-Inductor Bipolar-Output DC-DC Converter in Class-D Amplifier for Low Common Noise", IEEE Transactions on Power Electronics, vol. 31, No. 4, Apr. 2016, 12 pages.
Belloni, M. et al., "A high efficiency 4-output single inductor DC-DC buck converter with self boosted snubber", Analog Integr Circ Sig Process (2011) 67:169-177, DOI 10.1007/s10470-010-9570-9, Received: Sep. 13, 2010/ Revised: Nov. 22, 2010/ Accepted: Nov. 26, 2010/ Published online: Dec. 12, 2010, Springer Science +Business Media, LLC 2010, 9 pages.

* cited by examiner

INTEGRATED CIRCUIT AND RELATED AUDIO AMPLIFIER

CROSS-REFERENCE TO RELATED APPLICATIONS

This application claims priority to Italian Patent Application No. 102018000002466, filed on Feb. 7, 2018, which application is hereby incorporated herein by reference.

TECHNICAL FIELD

The present invention relates generally to an electronic system and method, and, in particular embodiments, to an integrated circuit and related audio amplifier.

BACKGROUND

FIG. 1 shows a typical audio system. In the example considered, the system comprises an audio signal generator 10, such as a radio, CD or MP3 player, generating an analog audio signal AS to be sent to at least one speaker SPK.

In the example considered, an audio amplifier 20 is connected between the audio signal generator 10 and the speaker SPK, which is configured to generate an amplified audio signal AAS by amplifying the analog audio signal AS provided by the audio signal generator 10.

For example, FIG. 2 shows a possible implementation of a so-called class-D audio amplifier 20. Specifically, in the example considered, the audio amplifier 20 comprises a waveform generator 202 generating a periodic triangular waveform signal TS, having typically a frequency between 250 kHz and 2.5 MHz. The triangular waveform signal TS is sent together with the audio signal AS to a comparator 204, which compares the audio signal AS with the triangular waveform signal TS thereby generating a square wave signal DS, whose duty-cycle varies as a function of the amplitude of the audio signal AS. The square wave signal DS is then amplified by an amplifier stage 206, thereby generating an amplified square wave signal ADS.

For example, FIG. 3 shows an example of the amplifier stage 206, which comprises a half-bridge comprising two electronic switches SW1 and SW2, such as (n-channel) Field Effect Transistors (FET), connected in series between two terminals 210 and 212 adapted to receive a DC supply voltage $V_{bat}$, such as a voltage provided by a battery. Usually, the (negative) terminal 212 represent a ground GND. In the example considered, the control terminals of the switches SW1 and SW2 (e.g., the gate terminals of respective transistors) are driven as a function of the digital signal DS. For example, in the example considered are shown two driver circuits 2062 and 2064 for the electronic switches SW1 and SW2, and a control circuit 2060 configured to generate the control signals for the driver circuits 2062 and 2064 as a function of the digital signal DS. Substantially, the amplifier 206 is configured to convert the amplitude of the digital signal DS to the value of the voltage received at the terminals 210 and 212, which generally is greater than the voltage of the digital signal DS. For example, the level of the signal DS may be 3 VDC and the voltage $V_{bat}$ may be 12 VDC. Accordingly, the square wave signal ADS at the intermediate point between the two switches SW1 and SW2 corresponds to an amplified version of the signal DS.

Finally, the amplified square wave signal ADS is sent to a low-pass or bandpass filter 208, which removes at least the high-frequency spectrum from the amplified signal square wave signal ADS, thereby generating an amplified audio signal AAS, which is proportional to the original audio signal AS.

For example, FIG. 4 shows an example a LC filter 208. Generally, the filter stage 208 comprises two input terminals for receiving the signal ADS provided by the amplifier stage 206, e.g., the input terminals are connected the intermediate point of the half-bridge and the ground GND shown in FIG. 3. Moreover, the filter stage 208 comprises two output terminals for connection to the speaker SPK. Specifically, in the example considered, the first input terminal is connected to the first output terminal via an inductor L, and the second input terminal and the second output terminal are short circuited to ground GND. Finally, a capacitance C is connected in parallel with the output, i.e., between the output terminals. Substantially similar (active or passive) low-pass or bandpass filters 208 are provided in most audio amplifier circuits and/or may be integrated also within the speaker SPK.

Accordingly, a class-D amplifier is based on the fact that the switching frequency of the amplifier 20 is significantly higher than the usual audio band (between 20 Hz and 20 kHz) and accordingly the high switching frequency may be filtered with the filter stage 208, thereby reconstructing the profile of the original audio signal AS.

In the context of digital audio data, the signal generator 10 may comprise an analog-to-digital converter (ADC) for generating the signal AS or the signal generator 10 may provide directly the digital signal DS. Accordingly, the blocks 202 and 204 are purely optional.

Generally, the audio system may also use a plurality of speakers SPK, such as two or four, with respective audio amplifiers 20 using different signals AS/DS.

Those of skill in the art will appreciate that the audio system usually comprises also one or more electronic converters 30 configured to generate the regulated supply voltages for the various blocks of the audio system, such as the supply voltage for the audio signal generator 10 and possibly the blocks 202 and 204 in order to generate the digital/binary signal DS, the supply signals for the control circuit 2060 and the driver circuits 2062 and 2064, etc.

For example, usually the converter 30 comprises a DC/DC converter, such as a converter configured to convert the voltage $V_{bat}$ into a lower supply voltage, such as a voltage between 1.5 and 3.3 VDC, e.g., 1.8 VDC, used by the digital circuits of the audio system and/or the low power analog processing circuits. Similarly, additional regulated voltages may be generated for the driver circuits 2062 and 2064, such as 4.5 VDC for the driver circuit 2064.

In case of a car radio, the design of the various components of the audio system may be challenging, because of the large variations of voltage $V_{bat}$ of the automotive battery. For example, during crank and dump, a typical battery voltage of 14.4V may sharply (in less than 2 ms) drop down to 4-5V or rise up to 40V. For a proper operation, the electronic converter 30 should thus be able to control the supply voltages of the audio system for all battery conditions.

SUMMARY

Various embodiments relate to integrated circuits for implementing an audio amplifier, such as a class-D audio amplifier.

In various embodiments, the die of the integrated circuit comprises a circuit configured to generate at least one PWM signal, an amplifier stage, an electronic converter circuit, and a control block.

Specifically, in various embodiments, the circuit is configured to generate the at least one PWM signal in response to at least one first clock signal. For example, the circuit may comprise for each of the at least one PWM signal, a respective terminal for receiving an analog audio signal, a triangular waveform generator configured to generate a triangular waveform signal in response to a respective first clock signal, and a comparator configured to generate the respective PWM signal by comparing the analog audio signal with the triangular waveform signal. Generally, the circuit may also comprise a signal generator configured to generate the analog audio signal or directly the at least one PWM signal. Similarly, the die may comprise a pad and a communication interface configured to receive digital audio data, and a processing circuit configured to convert the digital audio data into the analog audio signal or directly the at least one PWM signal.

In various embodiments, the amplifier stage has associated a first set of pads of the die, where each pad of the first set of pads is configured to provide a respective amplified PWM signal to an external low-pass or band-pass filter. Accordingly, the amplifier stage is configured to receive at input the at least one PWM signal and provide at output the amplified PWM signals.

For example, in various embodiments, the amplifier stage comprises for each pad of the first set of pads a half-bridge, respective drive circuits and a control circuit. Specifically, each half-bridge comprises a high-side switch and a low-side switch, where the intermediate point between the high-side switch and the low-side switch is connected to the respective pad of the first set of pads. A high-side driver circuit and a low-side driver circuit are used to drive the high-side switch and the low-side switch, respectively. The control circuit is configured to generate the control signals for the high-side driver circuit and the low-side driver circuit as a function of the at least one PWM signal.

In various embodiments, the electronic converter circuit has associated two power supply pads configured to be connected to a supply voltage, two inductor pads configured to be connected to an external inductor and a second set of pads, where each pad of the second set of pads is configured to provide a respective regulated voltage, where each pad of the second set of pads is arranged to be connected to a respective external capacitor. Accordingly, the electronic converter circuit is configured to generate the regulated voltages in order to supply the driver circuits and the control circuit of the amplifier stage.

For example, in various embodiments, the electronic converter circuit comprises a respective output terminal for each of the regulated voltages, where each of the output terminals of the electronic converter circuit is connected to a respective pad of the second set of pads. A first set of electronic switches is configured to selectively couple the two inductor pads to the two power supply pads for controlling the current flowing through the external inductor. A second set of electronic switches is arranged to sequentially couple the two inductor pads to the output terminals, thereby charging the external capacitors with the current flowing through the external inductor. Accordingly, a control circuit may drive the first set of electronic switches and the second set of electronic switches in response to a second clock signal in order to regulate each of the regulated voltages to a respective requested value.

For example, a first of the regulated voltages may be referred to the negative pad of the two power supply pads, whereby the respective pad of the second set of pads is arranged to be connected via the respective external capacitor to the negative pad of the two power supply pads, which represent a ground. The die of the integrated circuit may however also comprise a further pad, where the electronic converter circuit is configured to generate a further voltage at the further pad, where a second of the regulated voltages is referred to the further voltage, whereby the respective pad of the second set of pads is configured to be connected via the respective external capacitor to the further pad. Accordingly, the second voltage may be a voltage having a fixed or variable offset with respect to ground. For example, as will be described in the following, this may be useful when the half-bridge is connected between the two power supply pads, which may receive a variably supply voltage. In this case, the electronic converter circuit may regulate the further voltage to a value determined as a function of the value of the supply voltage connected to the two power supply pads. For example, this second regulated voltage may be used to supply the control circuit of the amplifier stage.

For example, for generating the second voltage referred to the further pad, the first set of electronic switches may comprise a first electronic switch connected between the positive power supply pad and the first inductor pad, and a second electronic switch connected between the second inductor pad and the negative power supply pad. The second set of electronic switches may comprise a third electronic switch connected between the second inductor pad and the pad of the second set of pads associated with the second of the regulated voltages, and a fourth electronic switch connected between the first inductor pad and the further pad. In this case, the control circuit of the electronic converter circuit may monitor the voltage between the pad of the second set of pads associated with the second of the regulated voltages and the further pad. During a charge phase, the control circuit may close the first and the second electronic switch, thereby increasing the current flowing through the external inductor.

Conversely, during a discharge phase, the control circuit may close the third and the fourth electronic switch, whereby the current flowing through the external inductor charges the external capacitor connected between the pad of the second set of pads associated with the second of the regulated voltages and the further pad, thereby increasing the respective voltage. Accordingly, the control circuit may regulate the duration of the charge phase and/or the discharge phase, such that the voltage corresponds to a requested value.

In various embodiments, the control block comprises an oscillator circuit configured to generate the at least one first clock signal and the second clock signal, whereby the switching activity of the first set of electronic switches and the second set of electronic switches is synchronized with the switching activity of the half-bridges of the amplifier stage. For example, the oscillator circuit may comprise an integrated oscillator and/or a Phase-Locked Loop. For example, the oscillator circuit may generate the at least one first clock signal and the second clock signal with one of the following frequencies:

the frequency of the second clock signal corresponds to the frequency of the at least one first clock signal;

the frequency of the second clock signal corresponds to a multiple of the frequency of the at least one first clock signal; or the frequency of the at least one first clock signal corresponds to a multiple of the frequency of the second clock signal.

In various embodiments, the circuit is configured to generate each of the at least one PWM signal in response to a respective first clock signal, and the oscillator circuit may apply a different phase difference to each of the at least one first clock signal and the second clock signal.

Additionally or alternatively, the control block may implement other functions. For example, the die of the integrated circuit may comprise at least one communication pad and the control block may comprise a communication interface for receiving control commands for controlling the operation of the electronic converter circuit and/or the amplifier stage; and/or transmitting information concerning the status of the electronic converter circuit and/or the amplifier stage.

BRIEF DESCRIPTION OF THE DRAWINGS

Embodiments of the present disclosure will now be described with reference to the annexed drawings, which are provided purely by way of non-limiting example and in which.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

In the following FIGS. 5 to 23 parts, elements or components which have already been described with reference to FIGS. 1 to 4 are denoted by the same references previously used in such Figures. The description of such previously described elements will not be repeated in the following in order not to overburden the present detailed description.

As mentioned before, various embodiments of the present application relate to an electronic converter 30*a*, such as an electronic converter 30*a* for an audio system (see also the description of FIGS. 1 to 4).

Figure 5:
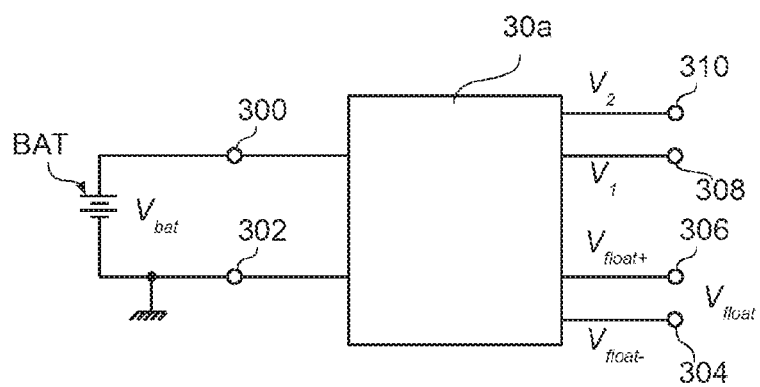
FIG. 5 shows an embodiment of an electronic converter configured to generate a regulated voltage in accordance with the present disclosure.

FIG. 5 shows the general architecture of an embodiment of the electronic converter 30*a*. Generally, the electronic converter 30*a* comprises two input terminals 300 and 302 for connection to a DC supply voltage $V_{bat}$, where the negative terminal 302 represent a ground GND. For example, the terminals 300 and 302 may be connected to a battery BAT, such as the battery of a vehicle, such as a car.

Figure 1:
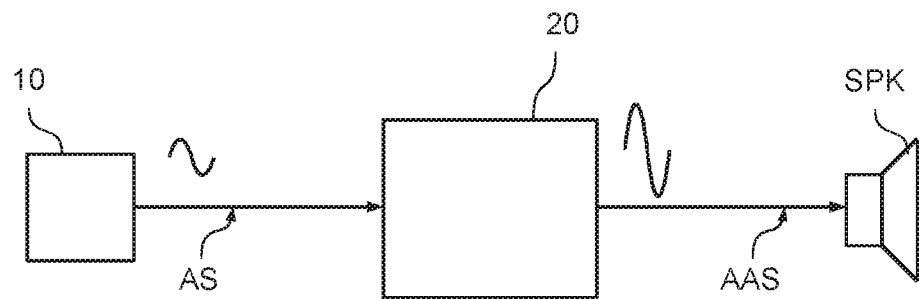
FIGS. 1, 2, 3 and 4 have already been described in the foregoing.
Figure 2:
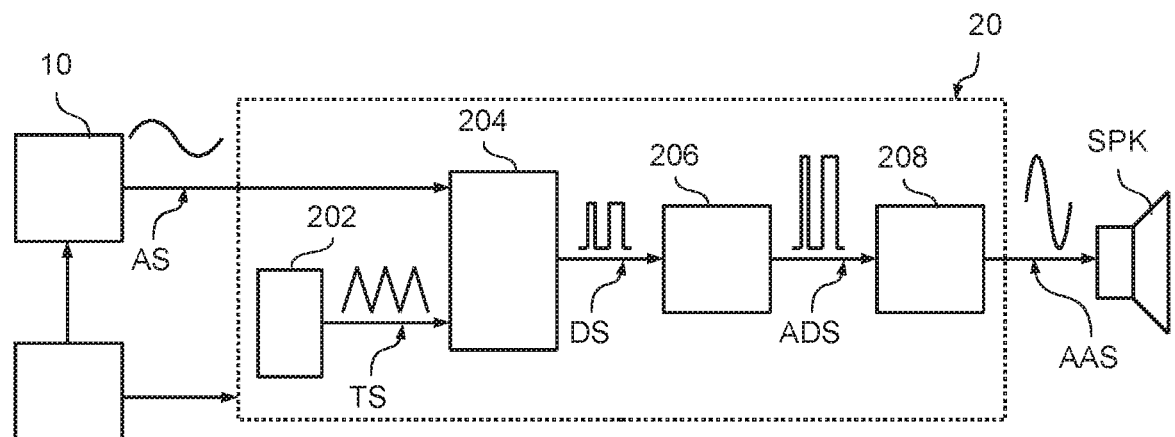

In the embodiment considered, the electronic converter 30*a* comprises at least two output terminals 304 and 306 for providing a regulated voltage $V_{float}$, which may e.g., be used to power one or more digital/analog circuits, such as the signal generator 10, and/or the blocks 202, 206 and/or the control circuit 2060 described in with respect to FIG. 2.

Specifically, in various embodiments, the voltage at the terminal 304 is not connected directly to ground GND, i.e., the voltage $V_{float-}$ between the (negative) terminal 304 and ground GND is not zero. However, the electronic converter 30*a* is configured to generate a regulated and substantially constant voltage $V_{float}$ between the terminals 304 and 306, such as 1.8 VDC.

Specifically, in various applications it may be desirable that the voltage $V_{float}$ is referred to a reference voltage $V_{ref}$, which is smaller than the voltage $V_{bat}$, i.e.:

$$0 < V_{ref} < V_{bat}$$

Specifically, in various embodiments, the converter 30a generates a voltage $V_{float+}$ between the positive terminal 306 and ground GND, which corresponds to:

$$V_{float+} = V_{ref} + V_{float}/2.$$

and a voltage $V_{float-}$ between the negative terminal 304 and ground GND which corresponds to:

$$V_{float-} = V_{ref} - V_{float}/2$$

whereby the voltage between the (positive) terminal 306 and the (negative) terminal 304 corresponds to $V_{float}$.

For example, in various embodiments, the reference voltage $V_{ref}$ is variable and set to 50% of the supply voltage $V_{bat}$ (or generally $V_{ref} = x*V_{bat}$, with 0<x<1). For example, the reference voltage $V_{ref}$ may be provided by an additional voltage regulator or a voltage divider.

Generally, such a floating voltage $V_{float}$ may be useful in many applications.

For example, in the case of an audio system, such a floating voltage $V_{float}$ may be used by the analog circuits, in particular by the circuit 2060, in order to improve the quality of the audio signal, in particular with respect to the signal/noise ratio. For example, this simplifies the implementation of unity-gain amplifier (as described, e.g., in documents Maxim, "APPLICATION NOTE 3977—Class-D Amplifiers: Fundamentals of Operation and Recent Developments", Jan. 31, 2007, available at https://www.maximintegrated-.com/en/app-notes/index.mvp/id/3977, or U.S. Pat. No. 8,558,618 B2, which are incorporated herein by reference), because the voltage gain of the amplifier stage 206 is unitary. Similarly, also the digital circuits may work with the floating voltage $V_{float}$ in order to simplify the interface between the digital and analog circuits.

Figure 6:
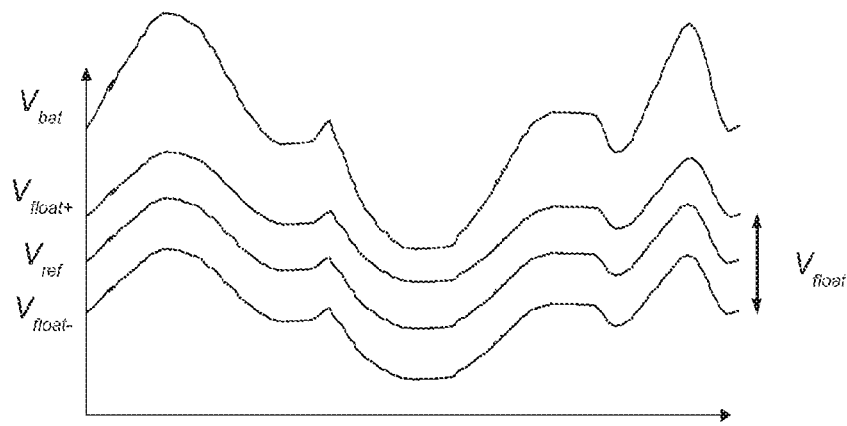
FIG. 6 shows an exemplary waveform of the regulated voltage generated by the electronic converter of FIG. 5.

For example, FIG. 6 shows exemplary waveform for the supply voltage $V_{bat}$, the reference voltage $V_{ref}$ and the voltages $V_{float+}$ and $V_{float-}$ (referred to ground GND).

As mentioned before, in case the converter 30a is powered via a vehicle battery BAT, the variation of the supply voltage $V_{bat}$ may be fast (<2 ms). In various embodiments, the converter 30a should thus be able to generate voltages $V_{float+}$ and $V_{float-}$ following such voltage variations. For example, this implies that the capacitances associated with the terminals 304 and 306 with respect to ground GND should be small.

In various embodiments (see, e.g., FIG. 5), the electronic converter 30a may also comprise one or more additional output terminals, such as terminals 308 and 310, for providing one or more additional supply voltages, such as voltages $V_1$ and $V_2$, which, e.g., may be used to power the driver circuits 2062 and 2064 arranged to drive the switches of a half-bridge. Generally, only a single terminal may be required for these voltages $V_1$ and $V_2$, insofar as these voltages may be referred to ground GND.

Accordingly, in various embodiments, the converter 30a receives at input a variable input voltage $V_{bat}$ and provides at output one or more voltages, which generally may be smaller or greater than the input voltage $V_{bat}$. Thus, generally, a plurality of electronic converters may be used, where each electronic converter is configured to generate a respective one of the voltages $V_{float+}$, $V_{float-}$, $V_1$ and $V_2$.

Figure 7:
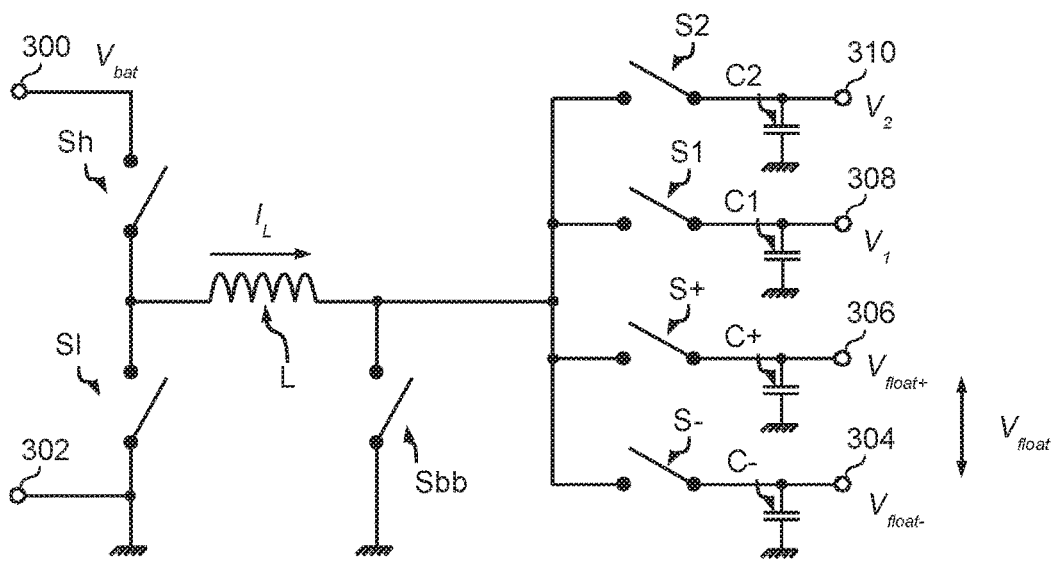
FIG. 7 shows a first embodiment of the electronic converter of FIG. 5.

Conversely FIG. 7 shows an embodiment of an electronic converter 30a configured to generate a plurality of the voltages $V_{float+}$, $V_{float-}$, $V_1$ and $V_2$.

Specifically, in the embodiment considered, a so called Single-Inductor Multiple-Output (SIMO) architecture is used. As the term implies, in this case, the electronic converter 30a comprises a single inductor L.

Specifically, in the embodiment considered, the electronic converter 30a comprise a half-bridge comprising two electronic switches Sh and Sl, such as (e.g., n-channel) FETs, connected (e.g., directly) in series between the terminals 300 and 302 arranged to receive the supply voltage $V_{bat}$, i.e., the terminals 300 and 302 may be connected (directly or via a cable) to the battery BAT.

In the embodiment considered, a first terminal of the inductor L is connected (e.g., directly) to the intermediate point between the switches Sl and Sh. The second terminal of the inductor L is connected (e.g., directly) via a further electronic switch Sbb to the negative terminal 302. Moreover, the second terminal of the inductor L is also connected (e.g., directly) via a respective switch, such as a (e.g., n-channel) FET, to each of the output terminals of the electronic converter 30a, i.e., the terminals 304, 306 and the optional terminals 308 and/or 310 For example, in the embodiment considered, the electronic converter 30a comprises:

an electronic switch S– connected (e.g., directly) between the second terminal of the inductor L and the terminal 304 providing the voltage $V_{float-}$;

an electronic switch S+ connected (e.g., directly) between the second terminal of the inductor L and the terminal 306 providing the voltage $V_{float+}$;

optionally an electronic switch S1 connected (e.g., directly) between the second terminal of the inductor L and the terminal 306 providing the voltage $V_1$; and optionally an electronic switch S2 connected (e.g., directly) between the second terminal of the inductor L and the terminal 308 providing the voltage $V_2$.

In various embodiments, each of the switches S–, S+, S1 and S2 may ensure that current may flow from the second inductor terminal towards the respective output terminal. For this purpose, each of the switches may be:

a bidirectional switch, e.g., by using two field effect transistors connected in opposite direction in series, e.g., in case of n-channel FET the drain of a first FET may be connected to the second inductor terminal, the drain of a second FET may be connected to the respective output terminal, and the source terminals of the two FETs may be connected together; or an unidirectional switch, e.g., by connecting a diode in series with a FET.

Moreover, as will be described in the following, the electronic switch associated with the output terminal 304, 306, etc., providing the highest output voltage (e.g., switch S2 associated with the terminal 310 providing the voltage $V_2$ to the driver circuit 2062), may also be implemented with a diode.

In the embodiment considered, a respective capacitor C+, C–, C1 and C2 is associated with each of the output terminals. Specifically, in the embodiment considered, each terminal 304, 306, 308 and 310 is connected (e.g., directly) via the respective capacitor C+, C–, C1 or C2 to ground GND.

Figure 8:
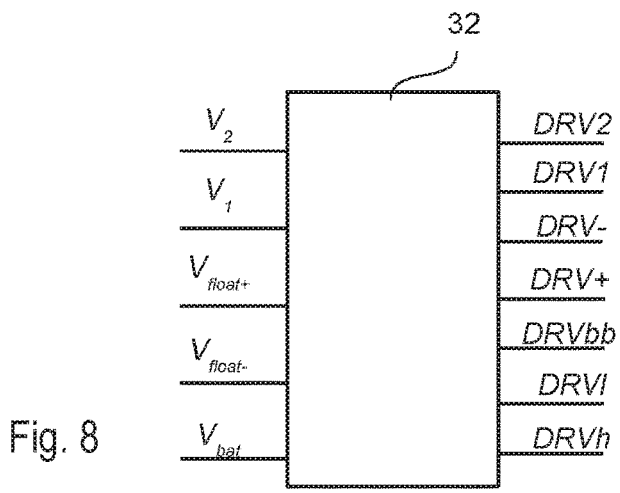
FIG. 8 shows an embodiment of a control circuit of the electronic converter of FIG. 7.

As shown in FIG. 8, the electronic converter 30a comprises also a control circuit 32 configured to generate drive signals DRVh, DRVl, DRVbb, DRV–, DRV+, DRV1 and DRV2 configured to drive the switches Sh, Sl, Sbb, S–, S+, S1 and S2, respectively, as a function of the output voltages $V_{float-}$, $V_{float+}$, $V_1$ and $V_2$, and the respective requested output voltages (not shown in FIG. 8).

Generally, by driving the switches in an appropriate manner, the converter 30a may be operated as buck (step-down), boost (step-up) or buck-boost converter.

For example, at the example of FIGS. 9A, 9B and 10 will be described a possible operation of the control circuit 32. Specifically, FIGS. 9A and 9B show two exemplary switching states of the converter of FIG. 7 and FIG. 10 shows a possible waveform of the current $I_L$ flowing through the inductor L.

Figure 9A:
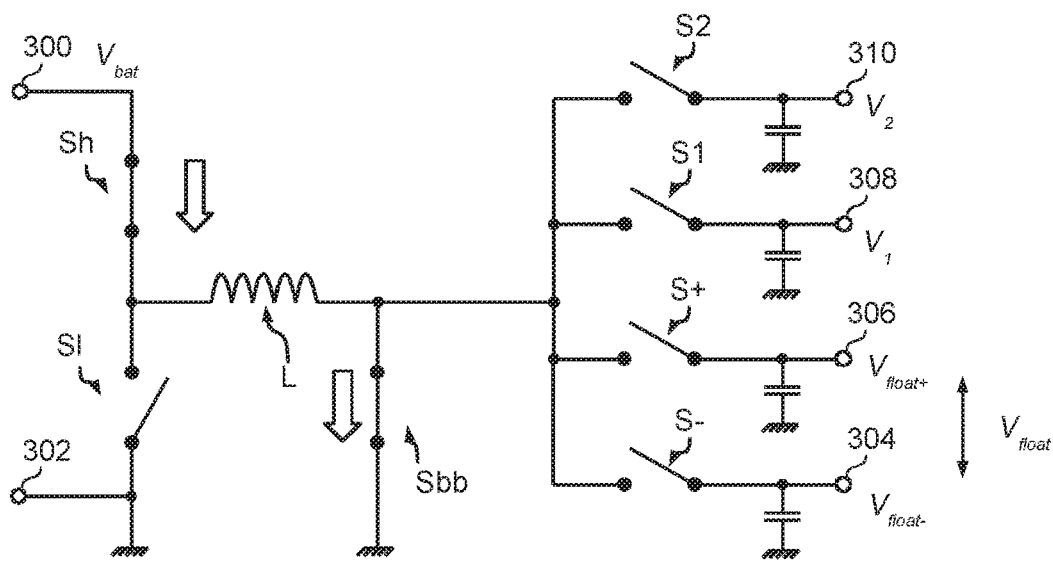
FIGS. 9A and 9B show possible switching states of the electronic converter of FIG. 7.
Figure 10:
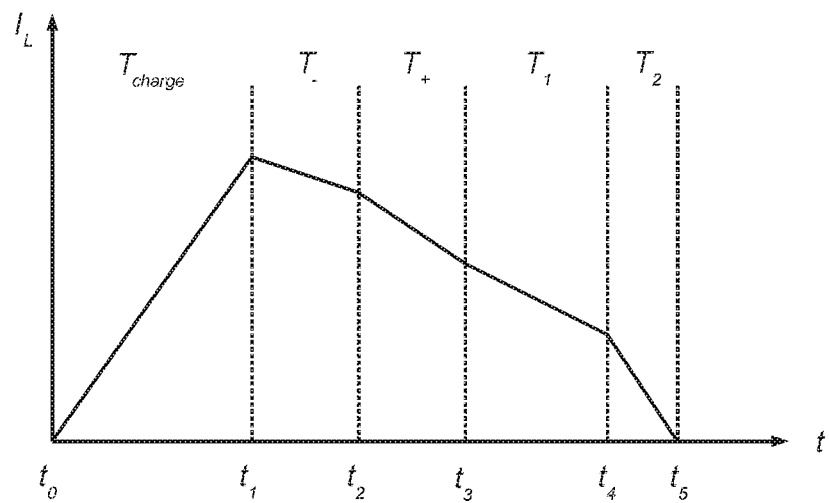
FIG. 10 shows a waveform of the behavior of the electronic converter of FIG. 7.

In the embodiment considered, the control circuit 32 closes at an instant $t_0$ and for a charge time $T_{charge}$ the switches Sh and Sbb and maintains opened the other switches (see FIG. 9A). Accordingly, during this phase the inductor L is connected to the supply voltage $V_{bat}$ and the current $I_L$ increase substantially linearly.

Figure 9B:
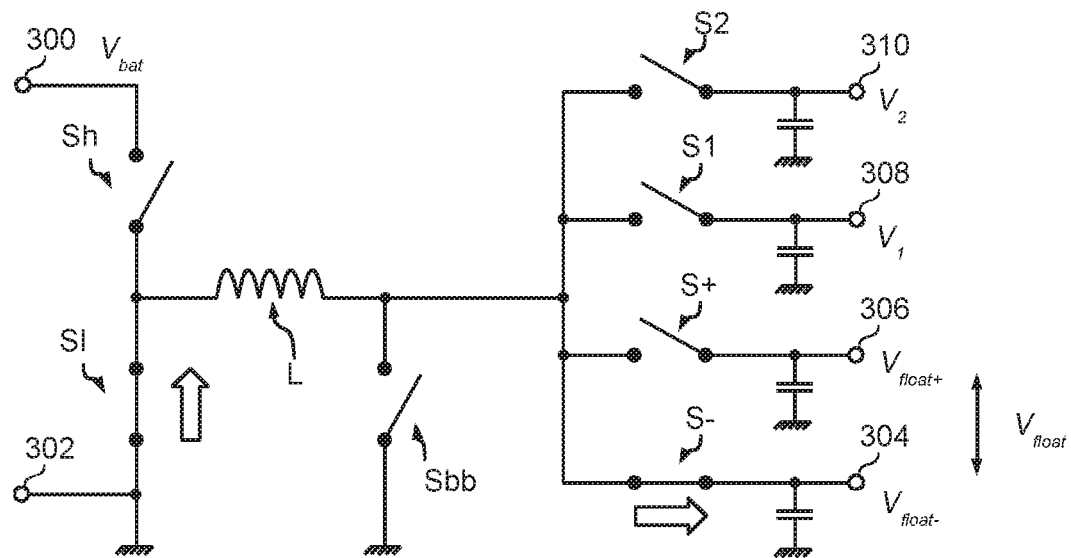

At the end of the charge interval $T_{charge}$, i.e., at an instant $t_1$, the control circuit 32 opened the switches Sh and Sbb, and closes the switch Sl and one of the output switches S+, S−, S1 or S2 associated with the outputs, such as the switch S− (see FIG. 9B). Accordingly, during a following time interval T− the inductor current $I_L$ flows to the output 304 and the voltage $V_{float-}$ increase, while the current $I_L$ decrease substantially linearly.

At an instant $t_2$, e.g., when the voltage $V_{float-}$ has reached the requested value, the control circuit 32 opened the previously closed output switch, e.g., the switch S−, and closes a next output switch, such as the switch S+. Accordingly, during a following time interval $T_+$ the inductor current $I_L$ flows to the output 306 and the voltage $V_{float+}$ increase, while the current $I_L$ decrease substantially linearly.

At an instant $t_3$, e.g., when the voltage $V_{float+}$ has reached the requested value, the control circuit 32 opened the previously closed output switch, e.g., the switch S+, and closes a next output switch, such as the switch S1. Accordingly, during a following time interval $T_1$ the inductor current $I_L$ flows to the output 308 and the voltage $V_1$ increase, while the current $I_L$ decrease substantially linearly.

At an instant $t_4$, e.g., when the voltage $V_1$ has reached the requested value, the control circuit 32 opened the previously closed output switch, e.g., the switch S1, and closes a next output switch, such as the switch S2. Accordingly, during a following time interval $T_2$ the inductor current $I_L$ flows to the output 310 and the voltage $V_2$ increase, while the current $I_L$ decrease substantially linearly.

At an instant $t_5$, e.g., when the voltage $V_2$ has reached the requested value, the control circuit 32 opened the previously closed output switch, e.g., the switch S2.

Generally, the sequence of the various discharge phases $T_+$, $T_-$, $T_1$, and $T_2$ may also be different, and the converter may use more or less phases in order to provide more or less output voltages.

The control circuit 32 may start a new cycle $T_{charge}$ at a fixed frequency or immediately with the instant $t_5$. The former being usually referred to as Pulse Width Modulation (PWM) mode, while the latter is usually called quasi resonant mode.

Specifically, in various embodiments, apart from regulating the durations of the various discharge phases, the control circuit 32 also regulates the duration of the charge phase $T_{charge}$ in order to ensure that sufficient energy is stored in the inductor L in order to reach the requested output voltages. For example, the control circuit 32 may use for this purpose the voltage at the output terminal corresponding to the last discharge phase, e.g., the voltage $V_2$ terminal 310.

For example, the control circuit 32 may increase the duration of the charge phase $T_{charge}$ when:

the inductor current $I_L$ reaches zero and the voltage is smaller than the requested value, or a new switching cycle starts with fixed frequency and the voltage is smaller than the requested value.

Similarly, the control circuit 32 may decrease the duration of the charge phase $T_{charge}$ when:

the voltage reaches the requested value and the inductor current $I_L$ is greater than zero, or in a complementary manner the inductor current $I_L$ reaches zero and the voltage is greater than the requested value, or a new switching cycle starts with fixed frequency and the voltage is greater than the requested value.

Thus, in the embodiment considered, the control circuit 32 may use a fixed reference values for the voltages $V_1$ and $V_2$, thereby providing substantially constant voltages $V_1$ and $V_2$. Conversely, the control circuit 32 may use variable reference values for the voltages $V_{float+}$ and $V_{float-}$ determined as a function of the voltage $V_{bat}$, thereby providing variable voltages $V_{float+}$ and $V_{float-}$, where the voltage $V_{float}$ between the terminals 304 and 306 is substantially constant (as described in the foregoing).

Generally, instead of using a single charge phase $T_{charge}$, the converter may use also a plurality of charge phases, e.g., a respective charge phase for each discharge phase. For example, in this case, the electronic converter 30a may be operated as a buck-boost converter, where a plurality of outputs is regulated sequentially. Accordingly, in the embodiment considered, the electronic converter 30a is used in a time-sharing mode, where the switches Sh, Sl and Sbb and the inductor L are sequentially used to provide power to one of the output capacitors (by closing one of the switches S−, S+, S1 or S2).

Again, as mentioned in the foregoing, the electronic converter 30a could also generate only the voltages $V_{float+}$ and $V_{float-}$. Moreover, based on the values of the supply voltage $V_{bat}$ and the requested output voltages, the control circuit 32 may operate the switches in order to implement other converter topologies, which control the current flowing through the inductor L, such as:

a buck converter, where the switch Sbb remains opened, and the control circuit 32 closes alternatively the switches Sh and Sl, e.g., in order to generate a voltage $V_1$ being smaller than the supply voltage $V_{bat}$.

a boost converter, where the switch Sh remains closed and the switch Sl remains opened, and the control circuit 32 closes alternatively the switch Sbb and e.g., the switch S2 in order to generate a voltage $V_2$ being greater than the supply voltage $V_{bat}$.

In various embodiments, due to the fact that the voltages $V_{float+}$ and $V_{float-}$ are between the minimum and the maximum value of the supply voltage $V_{bat}$, the control circuit 32 operates at least for these voltages the converter 30a as buck-boost converter as described in the foregoing.

While the solution described in the foregoing is a valid solution in order to generate constant or almost constant output voltage, e.g., the voltages $V_1$ and $V_2$, the solution may present some drawbacks for the generation of variable voltages, such as the voltages $V_{float+}$ and $V_{float-}$. For example, as mentioned in the foregoing, the supply voltage $V_{bat}$ and thus the reference voltage $V_{ref}$ may vary fast (<2 ms). Thus, the electronic converter 30a should be able to provide also voltages $V_{float+}$ and $V_{float-}$, which are able to follow these variations. However, the architecture shown in FIG. 7 requires the tank/output capacitors C+ and C−, which are charged by the current $I_L$. Moreover, the converter is operated sequentially with the time-sharing technique. Thus, the output capacitors may not be too small. For example, the capacitances of the capacitors C1 and C2 may be between 5 e 100 uF, e.g., approximately 10 uF. Thus, in order to follow variations having a frequency being greater than 100 Hz, large charge or discharge currents would be required, which would render the system less efficient.

Moreover, the voltages $V_{float+}$ and $V_{float-}$ are regulated independently, thereby using two separate control loops. These loops have to ensure a sufficient precision in order to obtain the requested voltage $V_{float}$.

Figure 11:
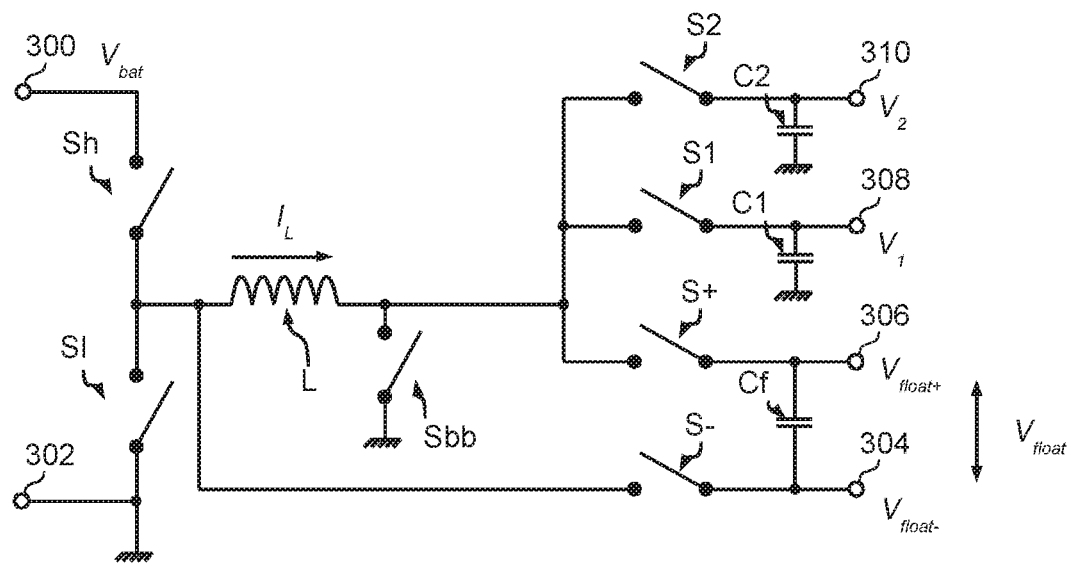
FIG. 11 shows a second embodiment of the electronic converter of FIG. 5.

FIG. 11 shows thus a second embodiment of the electronic converter 30a. Specifically, in the embodiment considered, the electronic switch S– associated with the terminal 304 providing the voltage $V_{float-}$ is not connected anymore to the second terminal of the inductor L, but to the first terminal of the inductor L, i.e., the intermediate point between the switches Sh and Sl of the half-bridge. Moreover, a single capacitor Cf is connected between the terminals 304 and 306. In some embodiments, the capacitors C+ and C– are thus omitted.

Figure 14A:
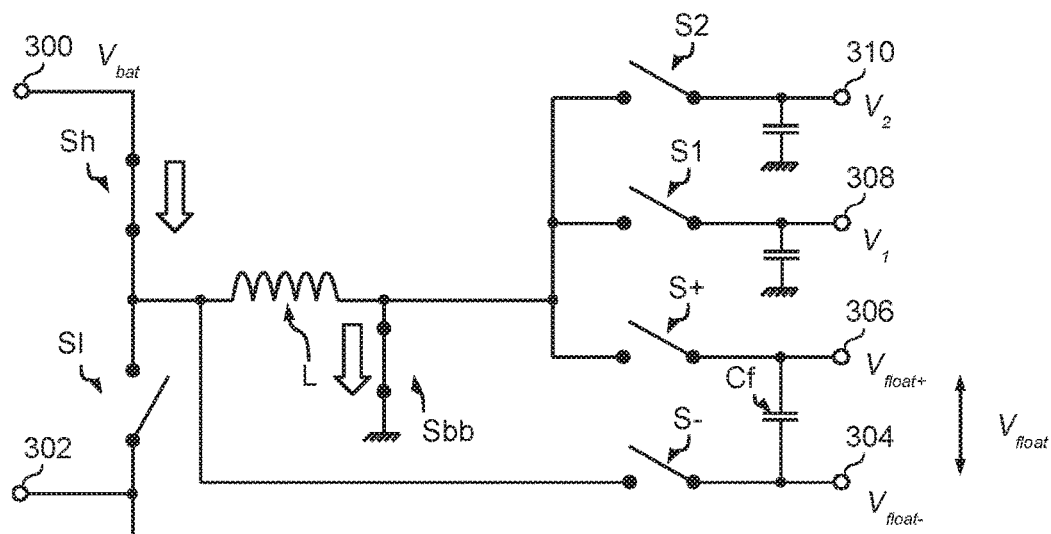
FIGS. 14A, 14B and 14C show possible switching states of the electronic converter of FIG. 11.
Figure 14B:
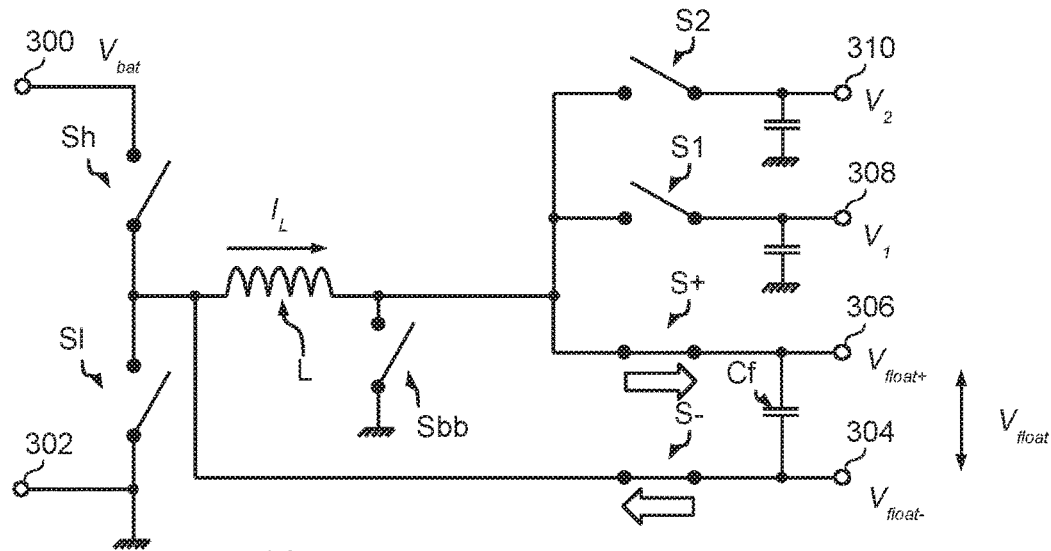
Figure 14C:
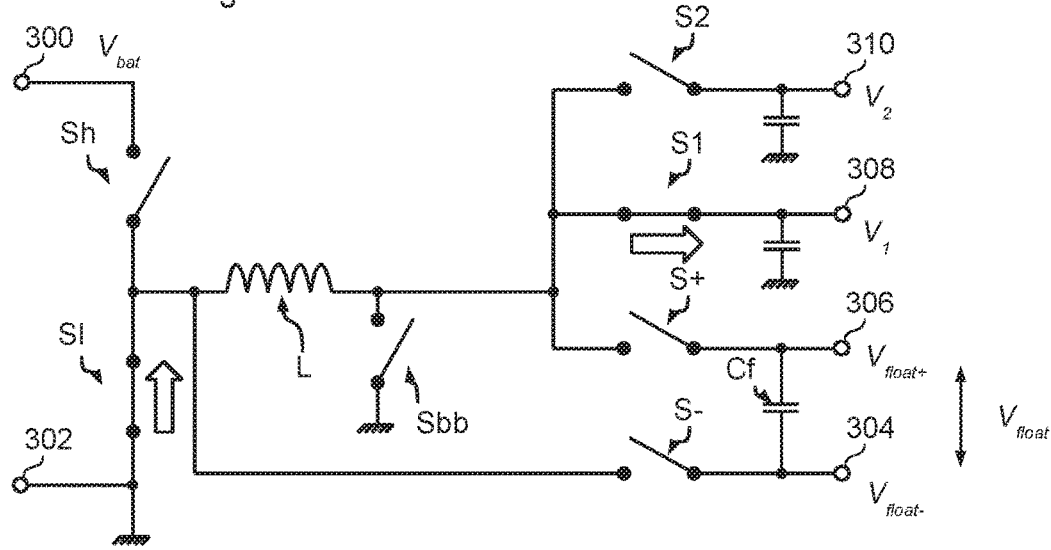

FIG. 13 shows again a possible waveform of the current $I_L$ flowing through the inductor L, and FIGS. 14A, 14B and 14C show various switching stages of the converter 30a.

Specifically, the control circuit 32 closes again at an instant $t_0$ and for a charge time $T_{charge}$ the switches Sh and Sbb and maintains opened the other switches (see FIG. 14A). Accordingly, during this phase the current $I_L$ increases substantially linearly. At an instant $t_1$, the control circuit 32 opens thus the switches Sh and Sbb and the charge phase ends.

Figure 12:
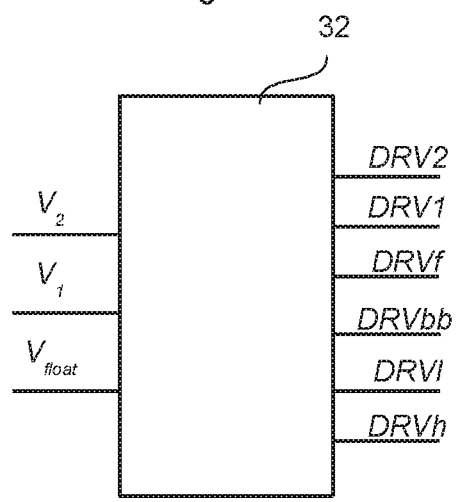
FIG. 12 shows an embodiment of a control circuit of the electronic converter of FIG. 11.
Figure 13:
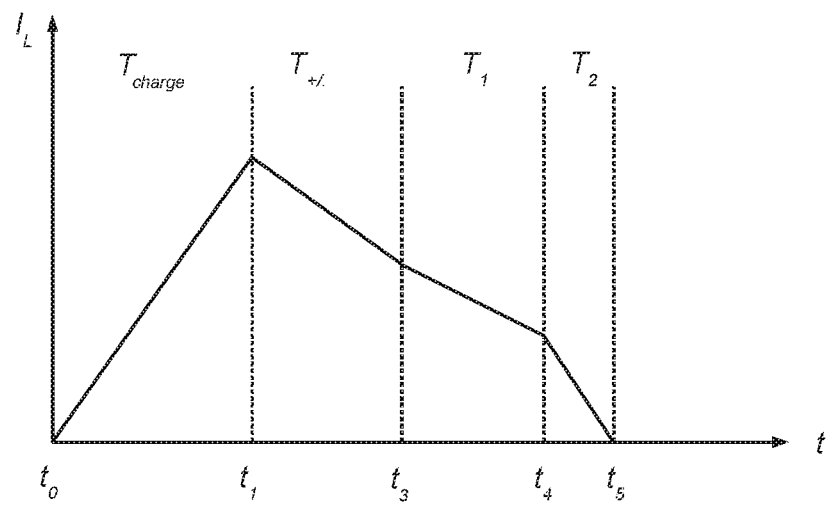
FIG. 13 shows a waveform of the behavior of the electronic converter of FIG. 11.

During the following discharge phases, the energy stored in the inductor L is then provided to the output terminals. Specifically, during one of the discharge phases $T_{+/-}$, e.g., the first discharge phase, the control circuit 32 drives the control terminal of the switches S+ and S– in order to close these switches, e.g., at the instant $t_1$ (see FIG. 14B). Accordingly, in this embodiment, the switches S+ and S– are closed during the same phase. As shown in FIG. 12, the control circuit 32 may thus generate (in addition to the drive signals DRVh, DRVl, DRVbb, DRV1 and DRV2 configured to drive the switches Sh, Sl, Sbb, S1 and S2, respectively) a common drive signal DRVf, which drives simultaneously the switches S+ and S–. Moreover, as shown in FIG. 12, in the embodiment considered, the control circuit 32 receives at input directly the voltage difference $V_{float}$.

Specifically, when both switches S+ and S– are closed, the inductor current $I_L$ will flow from the terminal 304 to the terminal 306, thereby charging the capacitor Cf. Thus, the voltage $V_{float+}$ will decrease and the voltage $V_{float-}$ will increase, whereby the $V_{float}$ between the terminals 304 and 306 will increase. Thus, in the embodiment considered, the current $I_L$ decrease substantially linearly and the control circuit 32 may switch off the switches S+ and S– at an instant $t_3$ directly when the voltage $V_{float}$ reaches the requested constant value. Generally, in case unidirectional switches are used for the switches S+ and S–, these switches should support the mentioned current flow direction, i.e., the switch S– should be configured to permit a current flow from the terminal 304 towards the first terminal of the inductor L (as a function of the respective drive signal DRV–/DRVf) and the switch S+ should be configured to permit a current flow from the second terminal of the inductor L towards the terminal 306 (as a function of the respective drive signal DRV+/DRVf).

Thus, at the instant $t_3$, the control circuit 32 opened the previously closed output switches S+ and S–, and closes the switch Sl and one of the other output switches, such as the switch S1 (see FIG. 14C). Accordingly, as in the previous embodiment, during a following time interval $T_1$ the inductor current $I_L$ flows now from ground GND (via the switches Sl an S1) to the output 308 and the voltage $V_1$ increase, while the current $I_L$ decrease substantially linearly.

At an instant $t_4$, e.g., when the voltage $V_1$ has reached the requested value, the control circuit 32 opened the previously closed output switch, e.g., the switch S1, and closes a next output switch, such as the switch S2. Accordingly, during a following time interval $T_2$ the inductor current $I_L$ flows to the output 310 and the voltage $V_2$ increase, while the current $I_L$ decrease substantially linearly.

At an instant $t_5$, e.g., when the voltage $V_2$ has reached the requested value, the control circuit 32 opened the previously closed output switch, e.g., the switch S2.

Again, the sequence of the various discharge phases $T_{+/-}$, $T_1$, and $T_2$ may also be different, and the converter may use more or less phases in order to provide more or less output voltages. Moreover, also in this case, a plurality of charge phase may be used, such as a respective charge phase for each discharge phase.

Thus, in the embodiment considered, during one of the discharge phases, both switches S+ and S– are closed (while the other switches Sh, Sl, Sbb, S1 and S2 are opened). Thus, in the embodiment considered, the inductor current $I_L$ charges the capacitor Cf and the control circuit may directly regulate the output voltage $V_{float}$.

Again, considering the voltage levels at the inductor L, the switch Sl and/or the switch connected to the output terminal providing the highest output voltage (e.g., the switch S2) may also be implemented with a diode, and the control unit 302 may thus not generate the respective drive signals, e.g., the drive signal DRVl for the switch Sl and the drive signal DRV2 for the switch S2.

In the embodiment shown in FIGS. 11 and 12, the control circuit 32 regulates only the voltage difference between the terminals 304 and 306, i.e., the voltage $V_{float}$. However, the control circuit 32 does not regulate the offset of the voltages $V_{float+}$ and $V_{float-}$ with respect to ground GND.

Generally, the control circuit 32 could thus also regulate the voltages $V_{float+}$ and $V_{float-}$ with respect to ground GND. For example, in an embodiment, the control circuit 32 could close both switches S+ and S– until either the voltage $V_{float+}$ or the voltage $V_{float-}$ reaches the requested reference value $(V_{ref}+/-V_{float}/2)$, and then either:

when the voltage $V_{float+}$ has reached the requested voltage $(V_{ref}+V_{float}/2)$, continue to discharge the terminal 302 towards ground GND (e.g., by closing the switch Sbb) or towards one of the other output terminals (e.g., via the switch S1 or S2); or when the voltage $V_{float-}$ has reached the requested voltage $(V_{ref}-V_{float}/2)$, continue to charge the terminal 304 from ground GND e.g., by opening the switch S– and closing the switch Sl.

Unfortunately, this control is rather complex and instead of using a single capacitor Cf, two capacitors C+ and C– would again be required. Substantially, in this case, the voltages $V_{float+}$ and $V_{float-}$ would have to be regulated again individually, with the associated complexity to obtain the requested variable values.

Figure 15:
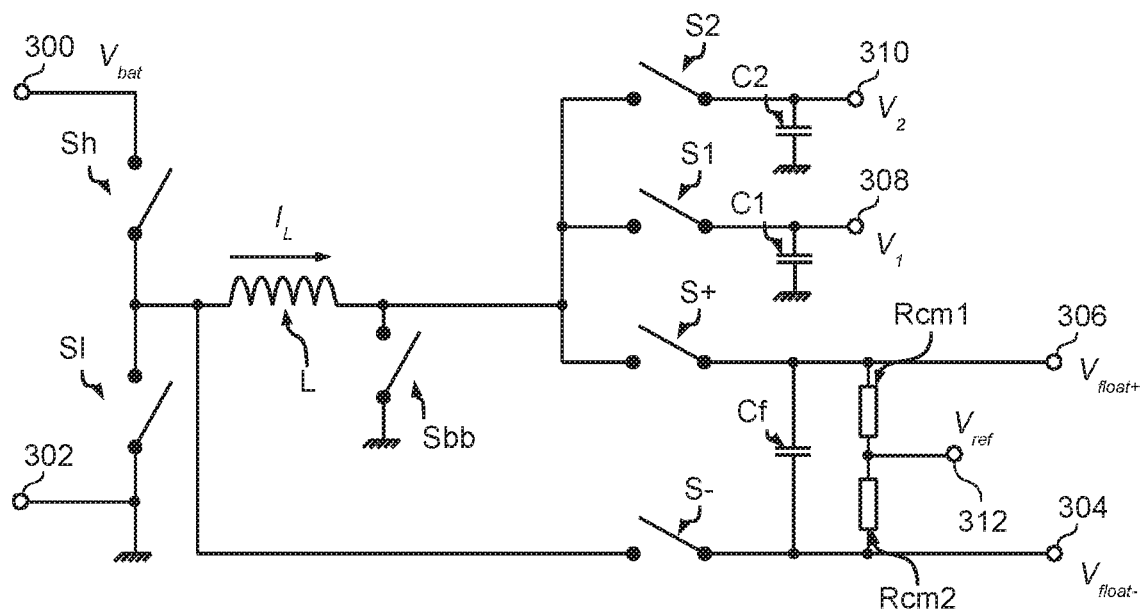
FIG. 15 shows a third embodiment of the electronic converter of FIG. 5.

FIG. 15 shows an embodiment, which permits a simplified control of voltage offset of the voltages $V_{float+}$ and $V_{float-}$. Specifically, in the embodiment considered, the control circuit 32 regulates the duration of the interval $T_{+/-}$ in order to obtain the requested voltage difference $V_{float}$ (as described with respect to FIGS. 11-14), however, the control circuit 32 does not regulate the voltage $V_{float+}$ and $V_{float-}$ with respect to ground GND. Conversely, the offset of these voltages $V_{float+}$ and $V_{float-}$ is imposed separately by coupling the terminals 302 and 304 to the reference voltage $V_{ref}$, representing a common mode for the terminals 302 and 304.

In various embodiments (see FIG. 16), the converter 30a may thus comprise a circuit 34 configured to generate the voltage $V_{ref}$ at a node/terminal 312 as a function of the voltage $V_{bat}$. For example, in various embodiments, the circuit 34 comprises a resistive voltage divider comprising two resistors Rref1 and Rref2 connected (e.g., directly) between the terminals 300 and 302. Accordingly, in the embodiment considered, the voltage $V_{ref}$ at the intermediate point between the two resistors Rref1 and Rref2 (representing the node/terminal 312 in the embodiment considered) will be proportional to the supply voltage $V_{bat}$ based on the values of the resistors Rref1 and Rref2. For example, in various embodiments, the resistors Rref1 and Rref2 have substantially the same value. Generally, the circuit 34 may also comprise more complex circuits for implementing a reference voltage generator, possibly comprising also amplifier stages (such as one or more operation amplifiers and/or current mirrors) in order to ensure a stable output voltage $V_{ref}$ for different load conditions at the node/terminal 312.

In the embodiments considered, the terminals 304 and 306 are coupled to the voltage $V_{ref}$ via respective resistors Rcm1 and Rcm2, i.e., a resistor Rcm1 is connected (e.g., directly) between the terminal 306 and the terminal 312 providing the voltage $V_{ref}$ (e.g., the intermediate point between the resistors Rref1 and Rref2) and a resistor Rcm2 is connected (e.g., directly) between the terminal 304 and the terminal 312. In order to obtain the voltages $V_{ref}+/-V_{float}/2$ the resistors Rcm1 and Rcm2 should have the same value. However, generally the resistors could also have different values, e.g., when a different scaling with respect to the ground GND is requested.

For example, assuming a switching frequency of 2 MHz, the inductance of the inductor L may be 10 µH, the capacitance of the capacitor Cf may be 10 µF, the resistances of the resistors Rcm1 and Rcm2 may be 10 kΩ and the resistances of the resistors Rref1 and Rref2 may be 10 kΩ. Accordingly, typically the inductor L, the capacitor Cf and the resistors Rcm1, Rcm2, Rref1 and Rref2 have values in the micro-henry (µH)/micro-farad (µF)/kilo-ohm (kΩ) range, respectively.

Figure 16:
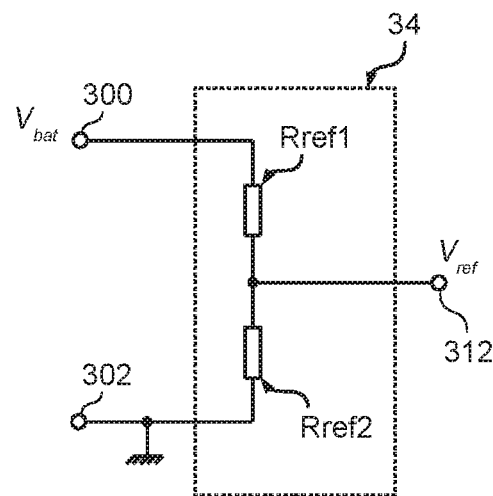
FIG. 16 shows an embodiment of a reference voltage generator for the electronic converter of FIG. 15.

The inventors have observed that the solution described with respect to FIGS. 15 and 16 is a valid solution, in particular when no high precision of the offsets $V_{float+}$ and $V_{float-}$ with respect to the ground GND is required. From a practical point of view, the circuit will however comprise also parasitic capacitance, such as capacitances associated with the first and second terminal of the inductor L.

Figure 17:
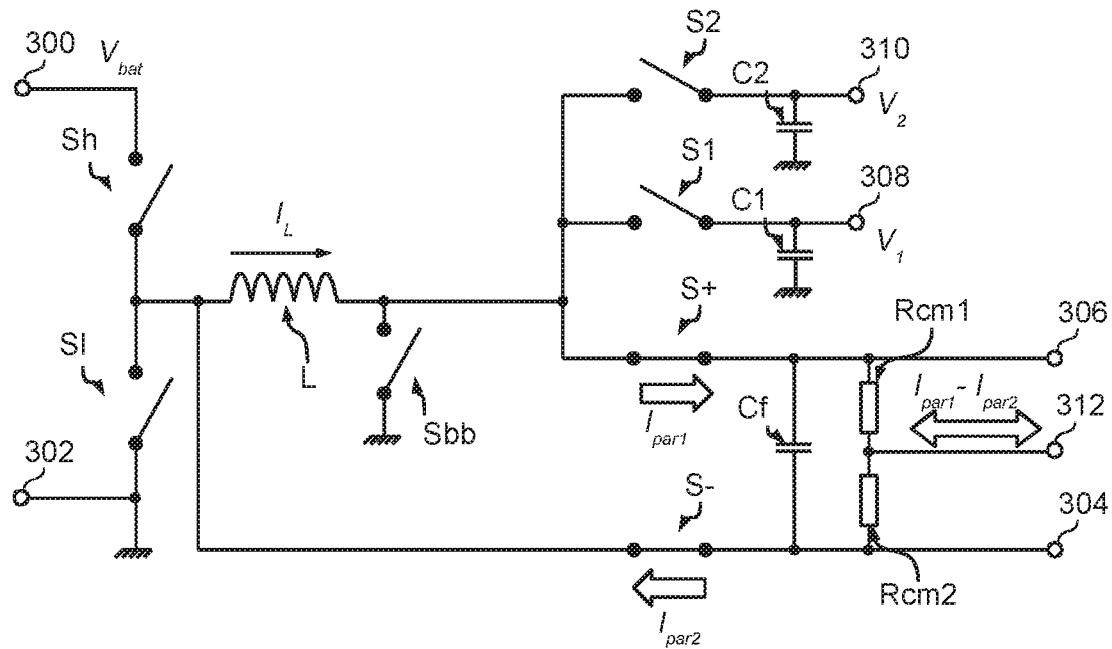
FIG. 17 show details of the parasitic behaviors of the electronic converter of FIG. 15.

For example, this is shown in FIG. 17, where parasitic currents $I_{par1}$ and $I_{par2}$ are flowing through the switches S+ and S−, respectively. Specifically, these parasitic currents $I_{par1}$ and $I_{par2}$ do not flow through the inductor L but towards the positive supply voltage $V_{bat}$ and/or ground GND. The inventors have observed that (based on the implementation of the switches S+ and S−) usually these parasitic current $I_{par1}$ and $I_{par2}$ flow only during a brief interval at the instant $t_1$ when the switches S+ and S− are closed, i.e., the duration of the current pulses is significantly smaller than the duration of the interval $T_{+/-}$. In principle, these parasitic currents $I_{par1}$ and $I_{par2}$ would not represent any particular issue, when their amplitude would be the same. However, in case the values are different, a current $(I_{par1}-I_{par2})$ will also flow towards the node 312 providing the reference voltage $V_{ref}$. For example, in case the reference voltage $V_{ref}$ is provided by a voltage divider (see FIG. 16), this current will vary the reference voltage $V_{ref}$ from the requested value.

Figure 18:
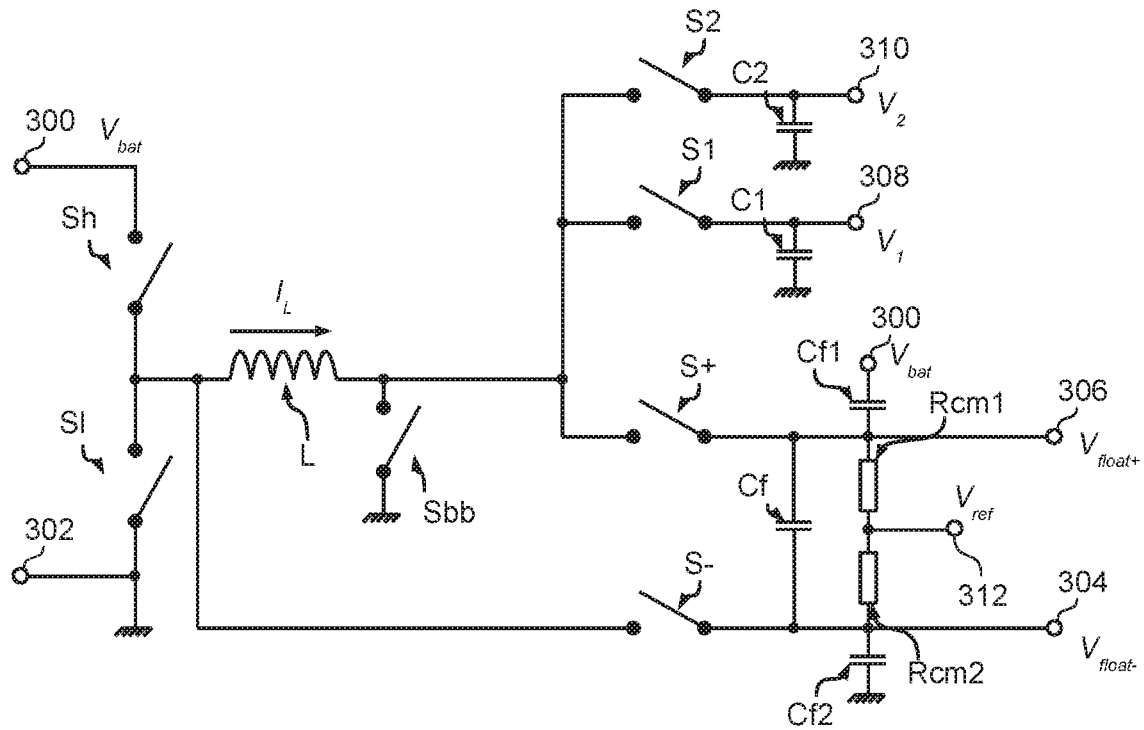
FIG. 18 shows a fourth embodiment of the electronic converter of FIG. 5.

FIG. 18 shows thus a modified embodiment that is capable of inhibiting or at least reducing this current flow towards the node 312. Specifically, in the embodiment considered, the electronic converter 30a comprises (in addition to the components described with respect to FIG. 15) at least one of:

a capacitor Cf1 connected (e.g., directly) between the terminal 306 and the terminal 300 providing the supply voltage $V_{bat}$; and a capacitor Cf2 connected (e.g., directly) between the terminal 304 and ground GND, i.e., the terminal 302.

In various embodiments, taking into account typical values for the parasitic current $I_{par1}$ and $I_{par2}$ the capacitors Cf1 and Cf2 may have a capacitance being significantly smaller than the capacitance of the capacitor Cf, such as less than 5%, preferably between 0.1% and 2%, preferably approximately 1%. For example, in various embodiments, the capacitance of the capacitors Cf1 and Cf2 is between 10 and 100 nF (nano-farad). In various embodiments, the capacitors Cf1 and Cf2 may have the same capacitance.

Accordingly, in the embodiment considered, the parasitic currents $I_{par1}$ and $I_{par2}$ will also flow. However, the current pulse $(I_{par1}-I_{par2})$ will not flow (or will flow less) towards the node 312 but through the low impedance path provided by the capacitor Cf1 and/or the capacitor Cf2 (and also the capacitor Cf).

Generally, the capacitors Cf1 and/or Cf2 may be connected to any reference voltage having a low impedance towards ground GND (as it is the case for the supply voltage $V_{bat}$). For example, the capacitors Cf1 may also be connected to the terminal 302 (instead of the terminal 300) and/or the capacitors Cf2 may also be connected to the terminal 300 (instead of the terminal 302).

Figure 19:
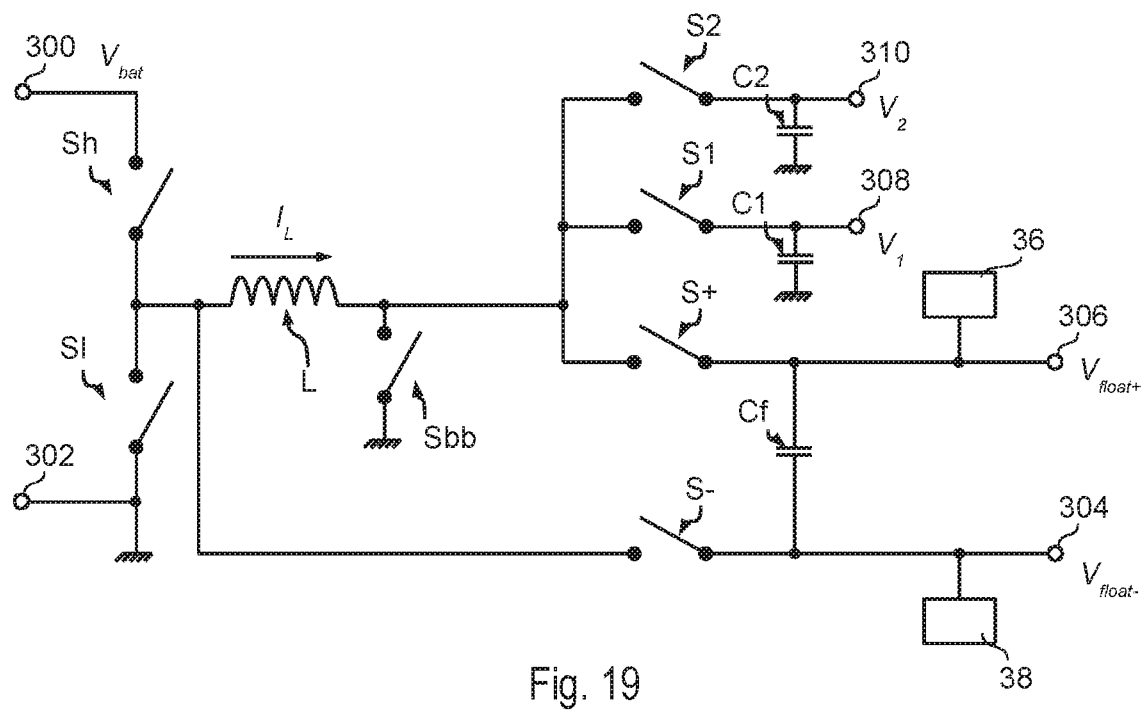
FIG. 19 shows a fifth embodiment of the electronic converter of FIG. 5.

FIG. 19 shows a second embodiment for obtaining the voltage offsets $V_{float+}$ and $V_{float-}$ with respect to ground GND. Specifically, the embodiment is based on the circuit shown in FIG. 11 and comprises in addition two further circuits:

a first clamp circuit 36 connected (e.g., directly) to the terminal 306; and a second clamp circuit 38 connected (e.g., directly) to the terminal 308.

Specifically, in the embodiment considered, the first clamp circuit 36 is configured to selectively permit a current flow towards the terminal 306 until the voltage corresponds to an upper voltage threshold $V_H$.

Figures 20, 21:
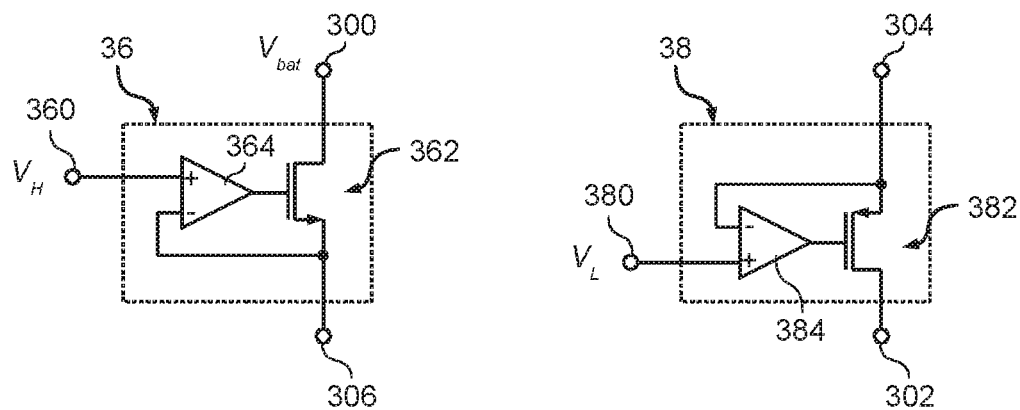
FIGS. 20 and 21 show embodiments of clamp circuits for the electronic converter of FIG. 19.

For example, as shown in FIG. 20, the clamp circuit 36 may comprise a transistor 362, such as a n-channel FET, such as an NMOS, connected (e.g., directly) between the terminal 300 providing the supply voltage $V_{bat}$ and the terminal 306.

In the embodiment considered, the gate terminal of the transistor 362 is driven by an operational amplifier 364. Specifically, in the embodiment considered, the operational amplifier 364 receives at the non-inverting/positive input terminal the upper voltage threshold $V_H$ and at the inverting/negative input terminal the voltage at the terminal 306.

Accordingly, the circuit 36 will drive the transistor 362 thereby permitting a current flow (from the supply voltage $V_{bat}$) towards the terminal 306, until the voltage at the terminal 306 reaches or is greater than the voltage $V_H$.

Conversely, in the embodiment considered, the second clamp circuit 38 is configured to selectively permit a current flow from the terminal 304 until the voltage corresponds to a lower voltage threshold $V_L$.

For example, as shown in FIG. 21, the clamp circuit 38 may comprise a transistor 382, such as a p-channel FET, such as a PMOS, connected (e.g., directly) between the terminal 304 and the terminal 302 (ground GND).

In the embodiment considered, the gate terminal of the transistor 382 is driven by an operational amplifier 384. Specifically, in the embodiment considered, the operational amplifier receives at the non-inverting/positive input terminal the lower voltage threshold $V_L$ and at the inverting/negative input terminal the voltage at the terminal 304.

Accordingly, the circuit 38 will drive the transistor 382 thereby permitting a current flow from the terminal 304 (towards ground GND), until the voltage at the terminal 304 reaches or is smaller than the voltage $V_L$.

In various embodiments, the clamp circuits 36 and 38 are not used to directly impose the voltages $V_{ref}+/-V_{float}/2$, but the clamp circuits set only approximately the voltages at the nodes 304 and 306 with respect to ground GND.

Specifically, in various embodiments, the upper and the lower threshold correspond to:

$$V_H = V_{ref} + V_{float}/2 - \Delta$$

$$V_L = V_{ref} - V_{float}/2 + \Delta$$

Accordingly, without any switching activity of the switches Sh, Sl, Sbb, the clamp circuits 36 and 38 would set the following voltages (via the coupling of the capacitor Cf):

$$V_{float+} = V_{ref} + V_{float}/2 - \Delta$$

$$V_{float-} = V_{ref} - V_{float}/2 + \Delta$$

and the voltage difference $V_{Diff}$ between the terminals 306 and 304 would be:

$$V_{Diff+} = V_{float} - 2\Delta$$

For example, in various embodiments, the value of $\Delta$ is selected between 5 and 20% of the value of $V_{float}$, e.g., $\Delta = 0.1\,V_{float}$. For example, $\Delta$ may be between 150 and 180 mV for $V_{float} = 1.8$ V.

Accordingly, once the control unit 32 drives the switches of the converter 30a, the control unit 32 will also regulate the voltage difference $V_{Diff}$ until the value corresponds to the requested value $V_{float}$.

When the supply voltage $V_{bat}$ remains constant, the clamp circuits 36 and 38 do not intervene during this regulation of the voltage difference $V_{Diff}$. Conversely, the clamp circuits 34 and 36 may absorb the current peaks generated by the parasitic current mentioned before and/or may intervene when the supply voltage $V_{bat}$ varies.

Figure 22:
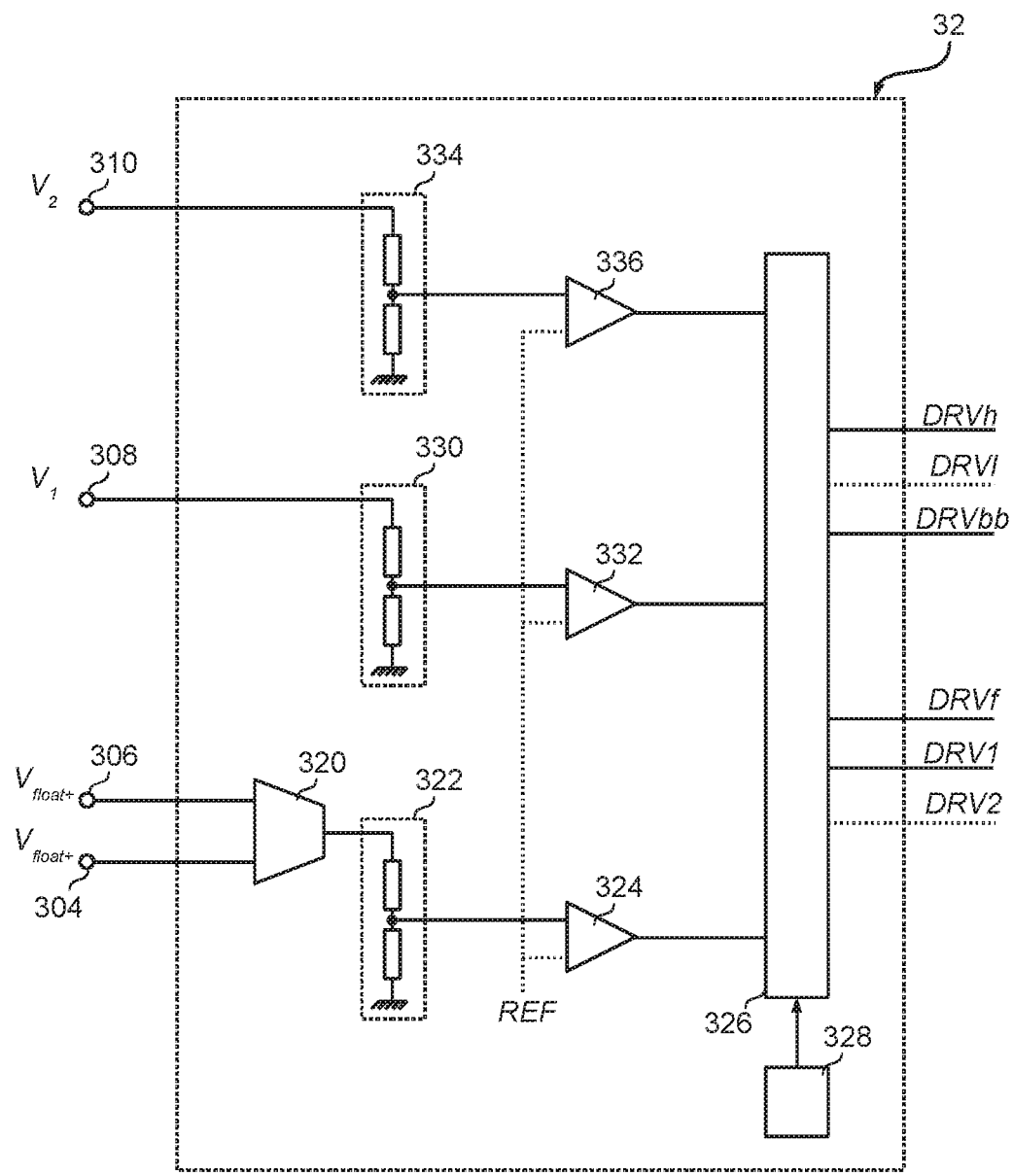
FIG. 22 shows an embodiment of a control circuit for the electronic converters of FIGS. 11, 15, 18 and 19.

FIG. 22 shows in this respect a possible embodiment of the control circuit 32. Specifically, in the embodiment considered, the voltages $V_{float+}$ and $V_{float-}$ are provided to a differential amplifier 320, e.g., based on an operation amplifier. The output of the differential amplifier 320 is connected to an error amplifier 324, such as a PI (Proportional-Integral) or PID (Proportional-Integral-Derivative) regulator, configured to generate an error signal as a function of the voltage difference and a reference signal REF. In the embodiment considered a scaling circuit and/or a current-voltage conversion circuit 322, such as a voltage divider comprising two resistors, may be connected between the differential amplifier 320 and the error amplifier 324.

In the embodiment considered, the optional voltages $V_1$ and $V_2$ may be provided similarly to respective error amplifiers 332 and 336. While also in this case may be used scaling circuits 330 and 334, usually no differential amplifiers are required, because the voltages $V_1$ and $V_2$ are referred to ground GND.

The error signals at the output of the error amplifiers 324, 332 and 336 are provided to a driver circuit 326. Specifically, in the embodiment considered, the driver circuit 326 is configured to manage the charge phase and the various discharge phases by generating the drive signals for the switches Sh, Sl, Sbb, S+, S− S1 and S2. Generally, the drive signal DRVl for the switch Sl and the drive signal DRV2 for the switch S2 are purely optional, because these switches may also be implemented with diodes.

For example, in various embodiments, the driver circuit 326 may be a Pulse-Width-Modulation (PWM) driver circuit. For this reason, the driver circuit 326 may have associated an oscillator 328 configured to generate an oscillator signal having a fixed frequency, i.e., a fixed switching period $T_{SW}$.

For example, once the oscillator signal indicates the start of a new switching cycle (corresponding essential to the instant $t_0$ of FIG. 13), the driver circuit 326 sets the drive signals DRVh and DRVbb for closing the switches Sh and Sbb. At the instant $t_1$, i.e., after the duration $T_{charge}$, the driver circuit 326 sets the drive signals DRVh and DRVbb for opening the switches Sh and Sbb. Accordingly, in the embodiment considered, these drive signals DRVh and DRVbb are PWM signals, which are set:

to a first logic level (e.g., high) for a switch-on duration corresponding to the duration $T_{charge}$; and to a second logic level (e.g., low) for a switch-off duration corresponding to $T_{SW} - T_{charge}$.

In the embodiment considered, the driver circuit 326 sets then (e.g., at the instant $t_1$) the drive signal DRVf for closing the switches S+ and S−. At the instant $t_3$, i.e., after the duration $T_{+/-}$, the driver circuit 326 sets the drive signal DRVf for opening the switches S+ and S−. Accordingly, in the embodiment considered, the drive signal DRVf is a PWM signal, which is set:

to a first logic level (e.g., high) for a switch-on duration corresponding to the duration $T_{+/-}$; and to a second logic level (e.g., low) for a switch-off duration corresponding to $T_{SW} - T_{+/-}$.

In the embodiment considered, the driver circuit 326 sets then (e.g., at the instant $t_3$) the drive signal DRV1 for closing the switch S1 (and possibly the drive signal DRVl for closing the switch Sl). At the instant $t_4$, i.e., after the duration $T_1$, the driver circuit 326 sets the drive signal DRV1 for opening the switch S1. Accordingly, in the embodiment considered, the drive signal DRV1 is a PWM signal, which is set:

to a first logic level (e.g., high) for a switch-on duration corresponding to the duration $T_1$; and to a second logic level (e.g., low) for a switch-off duration corresponding to $T_{SW} - T_1$.

Generally, the driver circuit 326 may then generate the drive signal DRV2 for the switch S2. Conversely, in the embodiment considered the switch S2 is implemented with a diode. Accordingly, when the switches S+, S− and S1 are opened, the current $I_L$ will flow through the diode S2 towards the terminal 310 until the current $I_L$ reaches zero or the switching duration $T_{SW}$ has finished.

Specifically, in the embodiment considered, the driver circuit 326 is configured to vary the switch-on durations $T_{+/-}$ and $T_1$ of the drive signals DRVf and DRV1 as a function of the error signals provided by the error amplifiers 324 and 332, respectively. Specifically, in the embodiment considered, the error amplifiers 324 and 332 will vary these durations (via the respective error signals) until the voltages $V_{float}$ and $V_1$ correspond to the respective requested values.

Conversely, in the embodiment considered, the driver circuit 326 is configured to vary the switch-on duration $T_{charge}$ of the drive signals DRVh and DRVbb as a function of the error signal provided by the error amplifiers 336. Specifically, in the embodiment considered, the error amplifier 336 will vary the duration (via the respective error signal), thereby varying the maximum current $I_L$, until the voltages $V_2$ correspond to the respective requested values. Additionally, the driver circuit 326 may vary the switch-on duration $T_{charge}$ also as a function of the error signals provided by the other error amplifiers, e.g., the amplifiers 324 and 332, which may be useful in order to perform a (predictive) control in case of short load variations of the outputs. For example, such an arrangement is useful when the error amplifiers 324, 332 and 336 have (in addition to an integral component) a proportional and/or derivative component.

Accordingly, in various embodiments, the control unit 32 is configured to manage the following phases which are repeated periodically:

a charge phase $T_{charge}$, where the control circuit 32 closes the switches Sh and Sbb for storing energy in the inductor L;

a (last) discharge phase, where the energy stored in the inductor L is transferred to an output; and one or more optional intermediate discharge phases between the charge phase and the last discharge phase, where the energy stored in the inductor L is transferred to one or more respective other outputs.

Generally, the discharge phase $T_{+/-}$ may be the last discharge phase or an intermediate discharge phase.

Specifically, in various embodiments, the control unit is configured to stop an intermediate phase when the respective output voltage reaches the requested value. Conversely, the last discharge phase is used to control the duration of the charge phase $T_{charge}$.

For example, by using a PWM modulation with constant switching cycle $T_{SW}$, the control unit 32 may:

increase the duration of the charge phase $T_{charge}$ (while maintaining the total duration $T_{SW}$) when, at the end of the last discharge phase, the respective output voltage is smaller than the requested value; and decrease the duration of the charge phase $T_{charge}$ (while maintaining the total duration $T_{SW}$) when, at the end of the last discharge phase, the respective output voltage is greater than the requested value.

Generally, the duration of the last discharge phase may also be constant. Thus, the control unit 32 may:

increase the duration of the charge phase $T_{charge}$ when, at the end of the last discharge phase, the respective output voltage is smaller than the requested value; and decrease the duration of the charge phase $T_{charge}$ when, at the end of the last discharge phase, the respective output voltage is greater than the requested value.

Figure 23:
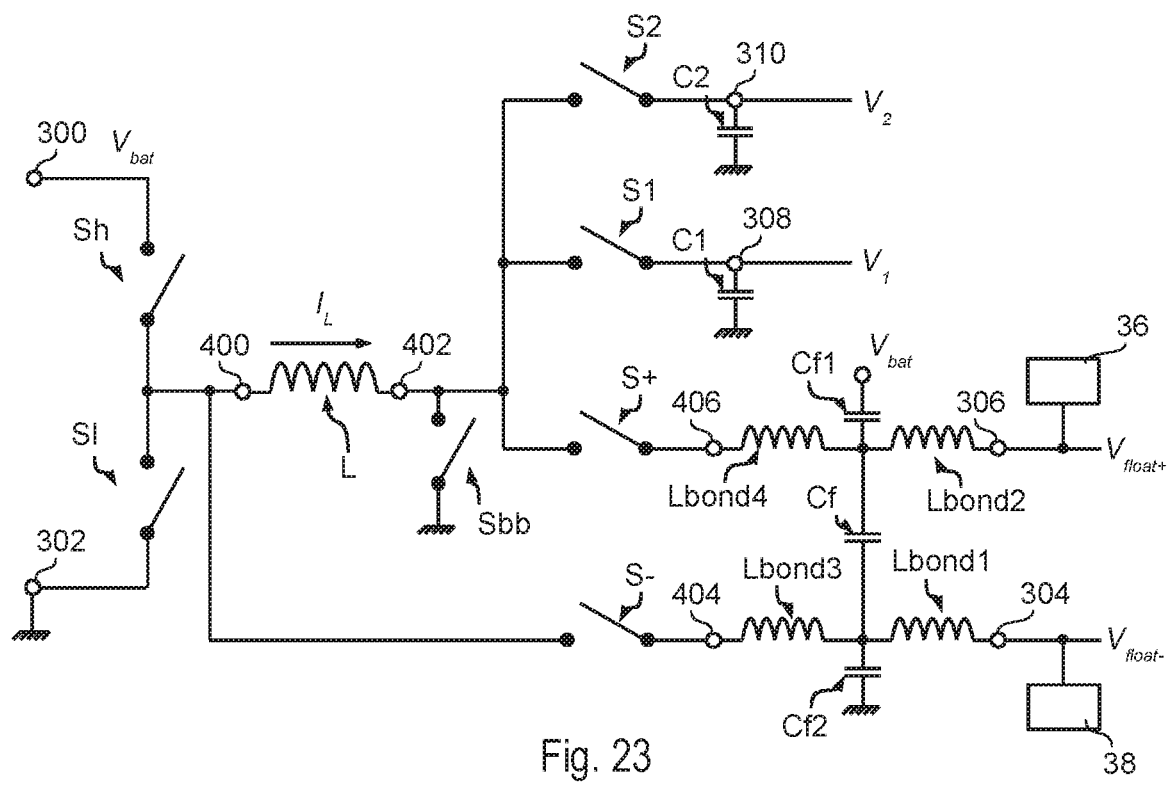
FIG. 23 shows a sixth embodiment of the electronic converter of FIG. 5.

Most of the components of the electronic converters 30a described in the foregoing may also be integrated in an integrated circuit. For example, FIG. 23 shows an embodiment, where such integrated circuit may comprise:

two pins/pads 300 and 302 for connection to the supply voltage $V_{bat}$;

the switches Sh, Sbb, S+ and S−;

the switch/diode Sl;

the optional switch S1;

the optional switch/diode S2;

the control circuit 32; and the optional clamp circuits 36 and 38.

In various embodiments, the integrated circuit does not comprise large inductors, capacitors and resistors, such as the inductor L, the capacitor Cf, and the capacitors C1 and C2, i.e., these components are external with respect to the integrated circuit. Conversely, small capacitors, such as the capacitors Cf1 and Cf2, and the various resistors described may be external or internal.

For example, in the embodiment considered, the integrated circuit comprises:

two pins/pads 400 and 402 for connection to an external inductor L;

a pin/pad 308 for connection to an external capacitor C1 (being optional insofar as the voltage $V_1$ is optional);

a pin/pad 310 for connection to an external capacitor C2 (being optional insofar as the voltage $V_2$ is optional); and at least two pins/pads for connection to the capacitor Cf.

Generally, the capacitor Cf may be connected directly to two pads/pins 304 and 306. Conversely, FIG. 23 shows an embodiment where four pins/pads 304, 306, 404 and 406 are used. Specifically, the pins/pads 404 and 406 are connected directly to the switches S− and S+, respectively. Conversely, the pins/pads 304 and 306 provide the voltages $V_{float-}$ and $V_{float+}$. Accordingly, in the embodiment considered, a first terminal of an external capacitor Cf may be connected to the pins/pads 304 and 404, thereby connecting the pin/pad 304 externally to the pin/pad 404, and a second terminal of the external capacitor Cf may be connected to the pins/pads 306 and 406, thereby connecting the pin/pad 306 externally to the pin/pad 406.

Specifically, this embodiment has the advantage that the parasitic inductances Lbond1, Lbond2, Lbond3 and Lbond4 of the bonding of the pins 304, 306, 404 and 404 implement with the capacitor Cf an improved filter stage for current peaks.

Generally, the various embodiments may also be combined. For example, in FIG. 23, the integrated circuit comprises also the clamp circuits 38 and 36 which are connected internally to the pins/pads 306 and 304.

Moreover, in the embodiment considered, the electronic converter comprises the capacitors Cf1 and Cf2, which are connected externally to the pins/pads 304/404 and 306/406, respectively.

Similarly, the electronic converter could also comprise the coupling resistors Rcm1 and Rcm2, which may be connected externally in parallel to the capacitor Cf or internally between the pins/pads 304/306 or 404/406.

Accordingly, the various embodiments described with respect to FIGS. 11 to 23 have the following advantages:

only a single phase $T_{+/-}$ is requested in order to regulate the output voltage $V_{float}$;

accordingly, only a single control loop may be required, because only a single drive signal DRVf may be used;

a single output capacitor Cf is required for providing the output voltage $V_{float}$; accordingly, except for the parasitic currents and the optional filter capacitors Cf1 and CF2, the current used to charge the output capacitor does not flow towards ground GND;

the offset voltages $V_{float+}$ and $V_{float-}$ may be regulated faster, because the capacitances of the respective terminals towards the supply voltage $V_{bat}$ and ground GND are small.

Moreover, as described in the foregoing, the same electronic converter 30a may be used to generate in addition to the voltage $V_{float}$ also one or more additional voltages $V_1$ and $V_2$. In case these voltages are absent, the respective switches S1 and S2, and also the switch/diode Sl may be omitted.

Thus, in various embodiments, the electronic converter 30a comprises two input terminals 300 and 302 configured to receive a supply voltage $V_{bat}$ and two output terminals 304 and 306 configured to provide a regulated voltage $V_{float}$.

In various embodiments, the electronic converter 30a comprises an inductor L comprising a first and a second terminal. A first electronic switch Sh is connected between the first input terminal 300 and the first terminal of the inductor L. A second electronic switch Sbb is connected between the second terminal of the inductor L and the second input terminal 302.

In various embodiments, the electronic converter 30a comprises moreover a third electronic switch S+ connected between the second terminal of the inductor L and the first output terminal 306 and a fourth electronic switch S− is connected between the first terminal of the inductor L and the second output terminal 304. A capacitor Cf is connected between the first output terminal 306 and the second output terminal 304.

In various embodiments, a control circuit 32 monitors the voltage between the two output terminals 304 and 306. During a charge phase $T_{charge}$, the control circuit 32 closes the first electronic switch Sh and the second electronic switch Sbb, thereby increasing the current $I_L$ flowing through the inductor L. During a discharge phase $T_{+/-}$, the control circuit 32 closes the third electronic switch S+ and the fourth electronic switch S−, whereby the current $I_L$ flowing through the inductor L charges the capacitor Cf, thereby increasing the voltage between the two output terminals.

In various embodiments, the control circuit 32 regulates the duration of the charge phase $T_{charge}$ and/or the discharge phase $T_{+/-}$, such that the voltage between the two output terminals 304 and 306 corresponds to a requested value $V_{float}$. For example, the control circuit 32 may determine whether, at the end of the discharge phase $T_{+/-}$, the voltage between the two output terminals 304 and 306 is greater than the requested value $V_{float}$. When, at the end of the discharge phase $T_{+/-}$, the voltage between the two output terminals 304 and 306 is smaller than the requested value $V_{float}$, the control circuit 32 may increase the duration of the charge phase $T_{charge}$. Conversely, when, at the end of the discharge phase $T_{+/-}$, the voltage between the two output terminals 304 and 306 is greater than the requested value $V_{float}$, the control circuit 32 may decrease the duration of the charge phase $T_{charge}$.

Generally, the electronic converter 30a may also comprise one or more further outputs. For example, in various embodiments, the electronic converter comprises a further output terminal 308 (and/or 310) configured to provide a further regulated voltage $V_1(V_2)$, where the further regulated voltage is referred to the second input terminal 302, which represents a ground. A further capacitor C1 (C2) is connected between the further output terminal 308 (310) and the second input terminal 302, where a further electronic switch S1 (S2) is connected between the second terminal of the inductor L and the further output terminal. In this case, the converter 30a comprises also a fifth electronic switch Sl connected between the first terminal of the inductor L and the second input terminal 302. Generally, the fifth electronic switch Sl and/or the further electronic switch S2 may be implemented with diodes.

In this case, the control circuit 32 may thus also regulate the further output voltage $V_1$ (and/or $V_2$). For example, during a further discharge phase $T_1$ ($T_2$), the control circuit 32 may close the fifth electronic switch Sl and the further electronic switch S1 (S2), whereby the current $I_L$ flowing through the inductor L charges now the further capacitor C1 (C2), thereby increasing the voltage between the further output terminal 308 (310) and the second input terminal (302). Similarly, the control circuit 32 may regulate the duration of the charge phase $T_{charge}$ and/or the further discharge phase $T_1$ ($T_2$), such that the voltage between the further output terminal and the second input terminal corresponds to a further requested value $V_1$ ($V_2$).

For example, in various embodiments, the control circuit 32 is configured for repeating periodically the charge phase, the discharge phase and the further discharge phase, where one of the discharge phases corresponds to a last discharge phase and the other of the discharge phases corresponds to an intermediate discharge phase between the charge phase and the last discharge phase. In this case, the control circuit 32 may stop the intermediate discharge phase when the respective voltage being increased during the intermediate discharge phase reaches the respective requested value. Moreover, the control circuit may increase the duration of the charge phase when, at the end of the last discharge phase, the respective voltage being increased during the last discharge phase is smaller than the respective requested value, and decrease the duration of the charge phase when, at the end of the last discharge phase, the respective voltage being increased during the last discharge phase is greater than the respective requested value.

Generally, the electronic converter 30a may also control the offset of the voltage between the two output terminals 304 and 306 with respect to the second input terminal 302, i.e., with respect to ground.

For example, in various embodiments, the electronic converter 30a comprises a reference voltage generator 34, such as a voltage divider, configured to generate a reference voltage $V_{ref}$ being preferably proportional to the supply voltage $V_{bat}$. In this case, a first resistor Rref1 may be connected between the first output terminal 300 and the reference voltage $V_{ref}$, and a second resistor Rref2 may be connected between the second output terminal 302 and the reference voltage $V_{ref}$.

In various embodiments, the electronic converter 30a may also be configured to filter parasitic current spikes. For this purpose, the electronic converter 30a may comprise a first capacitor Cf1 connected between the first output terminal 306, and the first input terminal 300 or the second input terminal 302. Additionally or alternatively, the electronic converter 30a may comprise a second capacitor Cf2 connected between the second output terminal 304, and the first input terminal 300 or the second input terminal 302.

Generally, in addition or as alternative to the coupling to the reference voltage $V_{ref}$, the converter 30a may also comprise clamp circuits 36 and/or 38 for limiting the voltage offset of the two output terminals with respect to the second input terminal, i.e., with respect to ground. Specifically, the electronic converter 30a may comprise a first clamp circuit 36 configured to selectively permit a current flow towards the first output terminal, until the voltage between the first output terminal and the second input terminal reaches or is greater than an upper voltage. The electronic converter may comprise also a second clamp circuit 38 configured to selectively permit a current flow from the second output terminal, until the voltage between the second output terminal and the second input terminal reaches or is smaller than a lower voltage.

Generally, both the electronic converter 30 and the audio amplifier 20 may be integrated in the same integrated circuit. Generally, similar to what has been describe with respect to FIG. 23, larger inductors and capacitors may be connected externally to the integrated circuit.

Figure 24:
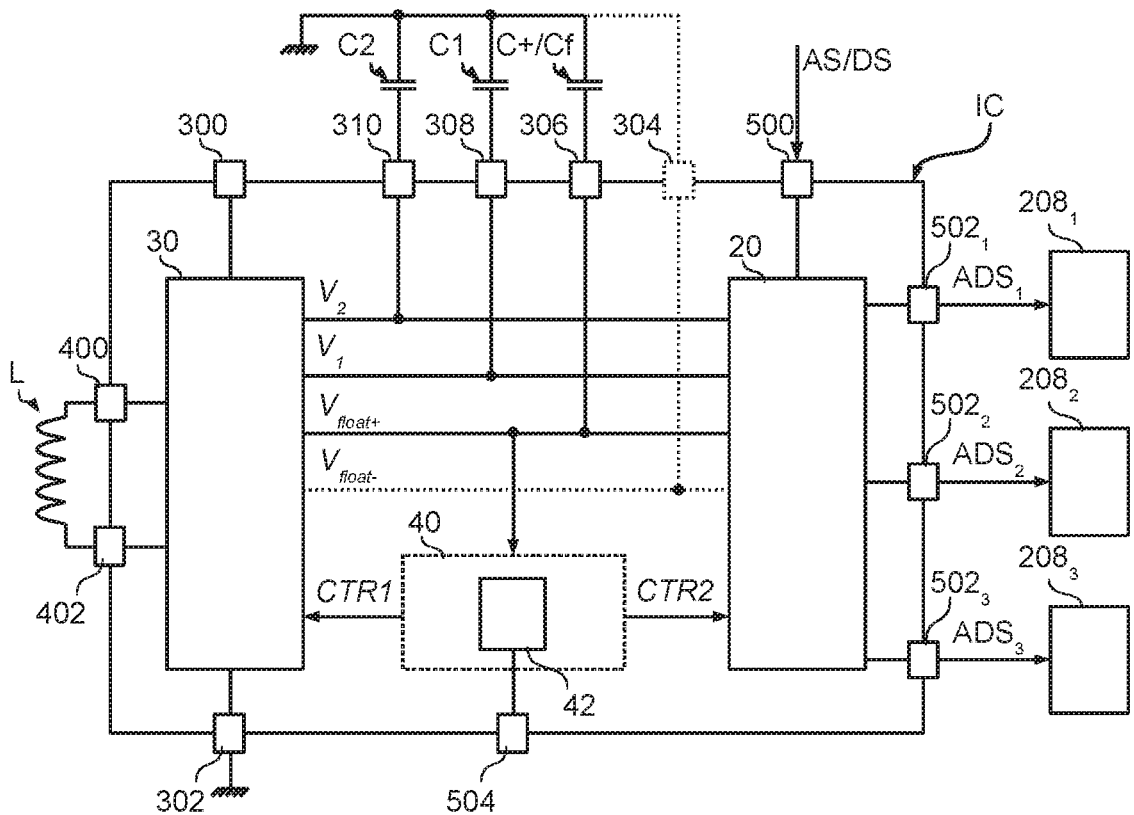
FIG. 24 shows an embodiment of an integrated circuit for implementing an audio amplifier with respective electronic converter.

For example, FIG. 24 shows an integrated circuit IC comprising the components in order to implement a class-D audio amplifier 20 with the respective electronic converter 30 configured to generate the supply voltages for the audio amplifier 20.

Generally, the term integrated circuit does not imply that the die is mounted within a package, but e.g., the die could also be mounted directly on a printed-circuit-board (PCB). Thus, the term pad is used to identify the pad of the die of the integrated circuit and the term pin identifies the pin or lead of an optional external package of the integrated circuit. Thus, when using the term "pad/pin" this indicates that the die has a pad and in case an external package is used, also the package has a corresponding pin, which is connected to the respective pad of the die, e.g., via wire bonding.

As described with respect to FIGS. 1 to 4, when using analog audio signals AS, a class-D audio amplifier 20 comprises a circuit for generating a PWM signal DS, where the duty cycle of the signal DS is proportional to the amplitude of the analog audio signal AS. For example, as described with respect to FIG. 2, a triangular waveform generator 202 and a comparator 204 may be used for this purpose. Generally, these blocks are purely optional, because the audio amplifier 20 may also receive directly the PWM signal DS, or other data identifying the signal DS, such as digital audio data.

Accordingly, in the embodiment considered, the integrated circuit IC comprises a pad/pin 500 for receiving an audio signal AS or DS. Generally, this pad/pin is purely optional, because the integrated circuit IC could also comprise directly an audio signal generator 10.

A class-D audio amplifier comprises also an amplifier stage 206, comprising a half-bridge SW1, SW2 which is driven as a function of the PWM signal DS, i.e., the amplifier stage 206 generates an amplified PWM signal ADS. Moreover, a class-D audio amplifier comprises a low-pass or band-pass filter stage 208 (see FIG. 4), such as a LC filter stage, which is configured to remove the frequency of the PWM signal.

Due to the fact, that the filter stage 208 comprises usually large inductors and/or capacitors, the filter stage 208 is preferably external to the integrated circuit IC.

Accordingly, in the embodiment considered, the integrated circuit IC comprises for each audio channel a respective pad/pin 502 configured to be connected via a respective filter stage 208 to one or more speakers 30. For example, in the embodiment considered, are shown three pads/pins $502_1$, $502_2$ and $502_3$ adapted to be connected to three filter stages $208_1$, $208_2$ and $208_3$. When using plural channels, the integrated circuit IC may also comprise a plurality of pins/pads 500 for receiving a plurality of respective audio signals.

In various embodiments, the number of channels (i.e., the number of amplified PWM signals ADS) may also be different from the number of the initial audio signals, e.g., the number of the analog audio signals AS. For example, in various embodiments, the audio signal AS may be a stereo signal having two channels (such as left and right), while the audio amplifier 20 may be configured to generate four amplified audio signals ADS for four speakers (such as front-left, front-right, rear-left, rear-right). For this purpose, the audio amplifier 20 may also perform a mixing operation.

Thus, in various embodiment, the die of the integrated circuit IC comprises a circuit for generating at least one PWM signal DS, such as the blocks 202 and 204, or the signal generator 10, or the pad(s) 500 which could also be used to directly receive the signal(s) DS. The die comprises also a set of pads 502 corresponding to the number of channels of the audio amplifier 20, where each pad 502 is configured to provide a respective amplified PWM signal ADS. Specifically, each of these pads 502 is arranged to be connected to a respective external low-pass or band-pass filter 208. Moreover, the die comprises an amplifier stage 206 configured to receive at input the at least one PWM signal DS and provide at output the amplified PWM signals ADS. Specifically, the amplifier stage 206 comprises for each pad 502 a half-bridge (comprising the high-side and low-side switches SW1 and SW2), where the intermediate point between the switches of the half-bridge is connected to a respective pad 502. With each half-bridge is associated a high-side driver circuit 2062 for driving the respective high-side switch SW1 and a low-side driver circuit 2064 for driving the respective low-side switch SW2, and a control circuit 2060 configured to generate the control signals for the high-side driver circuit 2062 and the low-side driver circuit 2064 as a function of the at least one PWM signal DS.

Figure 3:
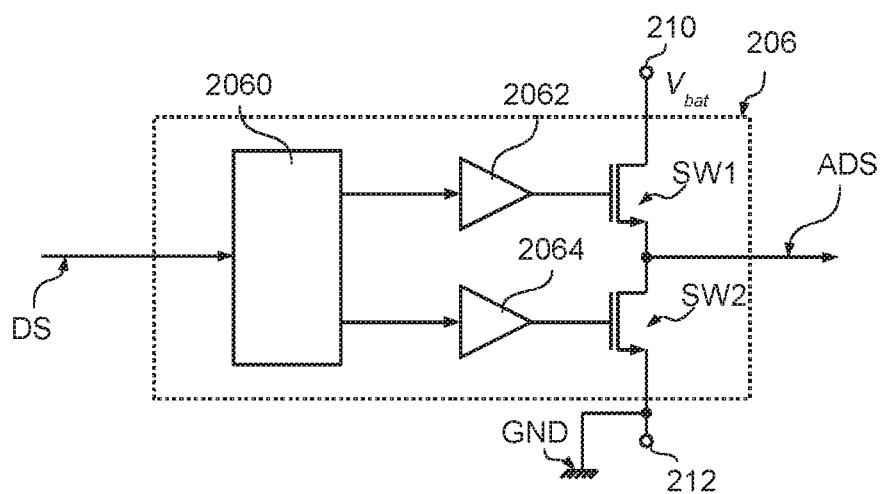
Figure 4:
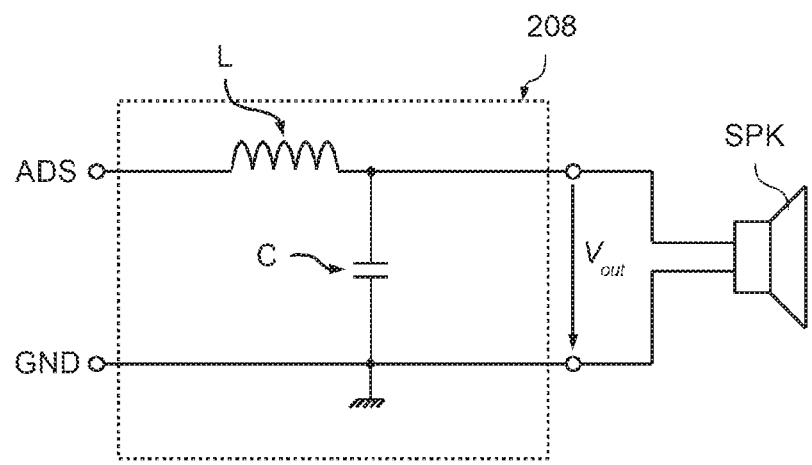

As described with respect to FIG. 3, the audio amplifier 20 uses a plurality of supply voltages, such as a voltage $V_2$ for the high-side driver 2062 and a voltage $V_1$ the low-side driver 2064. Preferably, the audio amplifier uses also a further supply voltage $V_{float}$, which supplies the analog and/or digital processing parts of the audio amplifier 20, such as the block 2060 and the optional blocks 202 and 204.

Specifically, as described in the foregoing, the supply voltage $V_{float}$ has preferably an offset with respect to ground, in order to place the voltage $V_{float}$ more or less at the center of the supply voltage used to supply the half-bridge of the amplifier stage 206, thereby simplifying the implementation of a unitary gain amplification. Thus, in case the half-bridge SW1/SW2 is powered via a variable voltage, such as a battery voltage $V_{bat}$, also the offset of the supply voltage $V_{float}$ with respect to ground should be variable, while the supply voltage $V_{float}$ itself should remain constant. Conversely, when the half-bridge SW1/SW2 is powered via a regulated supply voltage, such as the voltage $V_2$, also the offset of the voltage $V_{float}$ with respect to ground may be constant.

Accordingly, generally, the integrated circuit IC comprises two pads/pins 300 and 302 for receiving a supply voltage $V_{bat}$ and the electronic converter 30 is configured to generate a plurality of regulated voltages, which may have a fixed or variable offset with respect to ground. For example, in the embodiment considered, the electronic converter 30 generates two regulated voltages $V_1$ and $V_2$, which are referred to ground. Moreover, in the embodiment considered, the electronic converter 30 generates two voltages $V_{float+}$ and $V_{float-}$, where the electronic converter regulates the voltage $V_{float}=V_{float+}-V_{float-}$, and possibly also the voltages $V_{float+}$ and $V_{float-}$ with respect to ground. However, generally, also the voltage $V_{float}$ could be referred to ground, i.e., $V_{float-}=0$, and accordingly the voltage $V_{float-}$ is purely optional.

Based on the characteristics of the output voltages generated by the electronic converter 30, the electronic converter 30 may have one of the previous described architectures, such as those described with respect to the converter 30a. For example, when using a voltage $V_{float+}$ being referred to ground or having a fixed offset, also the converter shown in FIG. 7 may be used. Moreover, based on the characteristics of the supply voltage $V_{bat}$ the electronic converter 30/30a may be operated as boost, buck or buck-boost converter. For this reason, as described in the foregoing, one or more of the switches Sh, Sl and Sbb may be omitted or replaced with a diode.

In fact, based on the specific application, the electronic converter 30 may be a SIMO converter comprising:

a plurality of output terminals 306, 308, 310 (optionally the terminal 304) configured to provide a respective voltage to the audio amplifier 20, where a respective capacitor C+, C1, C2 (and optionally C−) is connected to each output terminal;

a single inductor L;

one or more electronic switches Sh, Sl, Sbb for controlling the current flowing through the inductor L;

one or more electronic switches S+, S1, S2 (and optionally S−) for forwarding the current flowing through the indicator L to a respective output terminal, thereby charging the capacitor associated with the respective output terminal; and a control circuit 32 configured to drive the electronic switches in order to regulate the voltages at the output terminals.

In the embodiment considered, the integrated circuit IC comprises thus the electronic switches of the electronic converter 30 and the control circuit 32, while the inductor L and the output capacitors are connected externally to the integrated circuit IC.

For example, in the embodiment considered, the integrated circuit IC comprises two pads/pins 400 and 402 for connection to the inductor L, and one or more pads/pins 306, 308 and 310 (and optionally 304) for connection to the capacitors. Specifically, in various embodiments, the die of the integrated circuit IC comprises:

two power supply pads 300 and 302 configured to be connected to a supply voltage $V_{bat}$;

two pads 400, 402 configured to be connected to an external inductor L; and a set of pads 306, 308 and 310, where each of these pads is configured to provide a respective regulated voltage $V_{float}$, $V_1$, $V_1$, where each of these pads is arranged to be connected to a respective external capacitor C+/Cf, C1 and C2.

Moreover, in various embodiments, the die comprises an electronic converter circuit configured to generate the regulated voltages $V_{float}$, $V_1$ and $V_2$, which are used to supply (at least) the high-side driver circuit 2062, the low-side driver circuit 2064 and the control circuit 2060 of the amplifier stage 206. Specifically, in the embodiment considered, the electronic converter circuit comprises a respective output terminal for each of the regulated voltages $V_{float}$, $V_1$ and $V_2$, where each of these output terminals is connected to a respective pad 306, 308, 310. The electronic converter circuit comprises also a first set of electronic switches Sh, Sl and Sbb configured to selectively couple the pads 400 and 402 (for the external inductor L) to the power supply pads 300 and 302 for controlling the current flowing through the external inductor L. Moreover, the electronic converter circuit comprises a second set of electronic switches S+, S1 and S2 configured to sequentially couple the pads 400 and 402 to the output terminals, thereby charging the external capacitors C+/Cf, C1 and C2 with the current flowing through the external inductor L. Accordingly, the control circuit 32 of the electronic converter circuit may drive the electronic switches Sh, Sl, Sbb, S+, S1 and S2 in order to regulate each of the regulated voltages $V_{float}$, $V_1$ and $V_2$ to a respective requested value.

In various embodiments, the integrated circuit IC comprises also a common control block 40. Generally, the control block 40 may be implemented with any suitable analog or mixed analog/digital circuit. In various embodiments, the common control block 40 may be powered via one of the voltages generated by the electronic converter 30, such as the floating voltage $V_{float}$ or the voltage $V_1$, or possibly an externally provided regulated voltage.

For example, in various embodiments, the control block 40 is configured to control and/or monitor the operation of the electronic converter 30 (including the control circuit 32) and the audio amplifier 20.

For example, in various embodiments, the integrated circuit IC comprises one or more pads/pins 504 for exchanging status and/or control data. Specifically, these one or more pads/pins 504 are connected to the control block 40 for transmitting control commands to the control block 40 and/or for receiving status information from to the control block 40. For example, the one or more pads/pins 504 may be connected to a communication interface 42 of the control block 40, such as a serial communication interfaces, such as a Universal Asynchronous Receiver-Transmitter (UART), Inter Integrated Circuit (I²C) or Serial Peripheral Interface (SPI) communication interface.

For example, the interface 42 may be used to generate control signals CTR1 for setting one or more parameters of the electronic converter 30, such as output voltage values, number of active outputs, PWM switching frequency, and/or control signals CTR2 for setting one or more parameters of the audio amplifier 20, such as the gain of the various channels. Similarly, the interface 42 may be used to provide one or more status information of the electronic converter 30, such as possible error states (e.g., derived from an incorrect or missing connection of the inductor L or the output capacitors; or a malfunction of an electronic switch of the converter), the value of the supply voltage $V_{bat}$ and/or the output voltages, and/or the audio amplifier 20, such as whether a short circuit or an open load condition has been detected at the outputs 502.

Generally, the control block 40 may exchange the status and/or control information with the electronic converter 30 and the audio amplifier 20 via any suitable communication, including also bus systems, such as a shared bus. However, in various embodiments, also two separate bus systems may be used for the communication with the electronic converter 30 and the audio amplifier 20, respectively. Generally, also the electronic converter 30 may exchange data with the audio amplifier 20, such as signals referring to the temperatures of the amplifier's power transistors SW1/Sw2, output current level and/or output voltage, supply voltage and so on.

Figure 25:
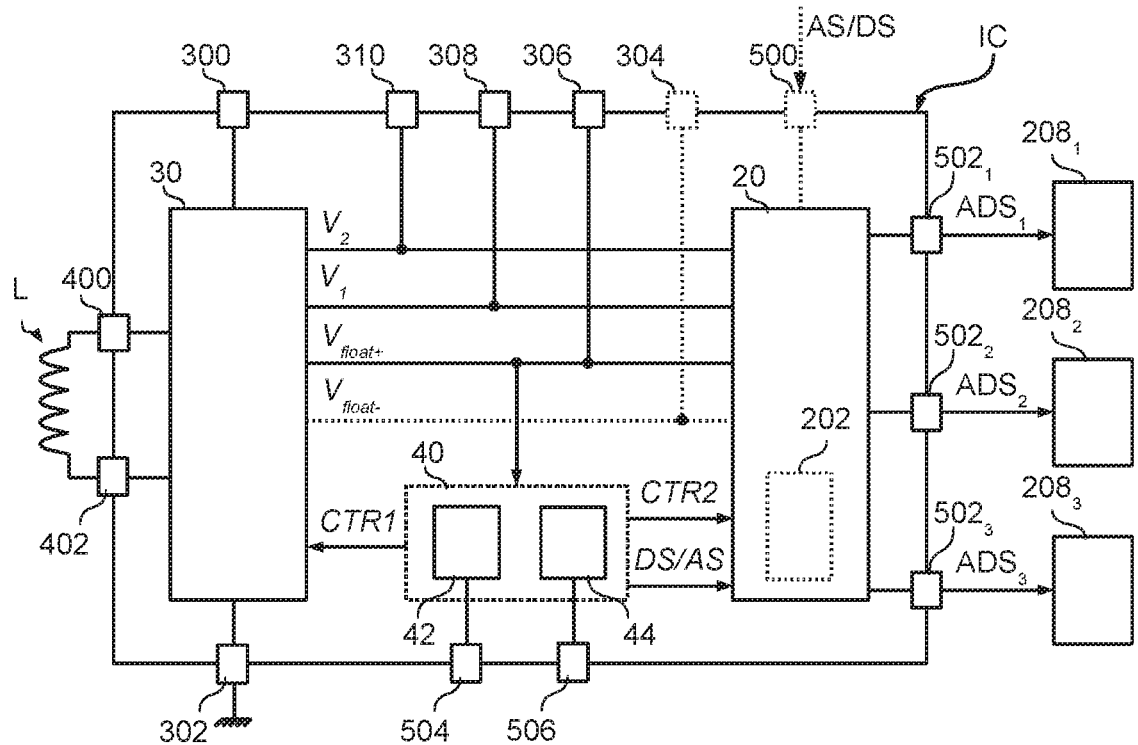
FIGS. 25 and 26 show various embodiments of a control block of the integrated circuit of FIG. 24.

As shown in FIG. 25, in various embodiments, the common control block 40 may comprise a communication interface 44 for receiving digital audio data, such as an Integrated Interchip Sound (I²S) interface, where the interface 44 is connected to one or more further pads/pins 506 of the integrated circuit IC. In this case, the common control block 42 comprises a processing circuit (e.g., included in the interface 44) for converting the digital audio data into an analog audio signal AS or a pulse width modulated signal DS. In this case, the pads/pins 500 may thus be omitted. However, the pads/pins 500 may be provided also in addition to the pads/pins 506 and, e.g., the control interface 42 may be used to select the source for the audio data (i.e., either the pads/pins 500 or the pads/pins 506) to be used by the audio amplifier 20.

In various embodiments, the common control block 40 may generate also one or more reference signals for the electronic converter 30 and/or the audio amplifier 20, such as the signal REF for the control circuit 32 shown in FIG. 22.

Moreover, as mentioned before the electronic converter 30, in particular the control circuit 32 may use a clock signal for generating the various drive signals for the electronic switches of the electronic converter 30 with a constant switching cycle period.

Figure 26:
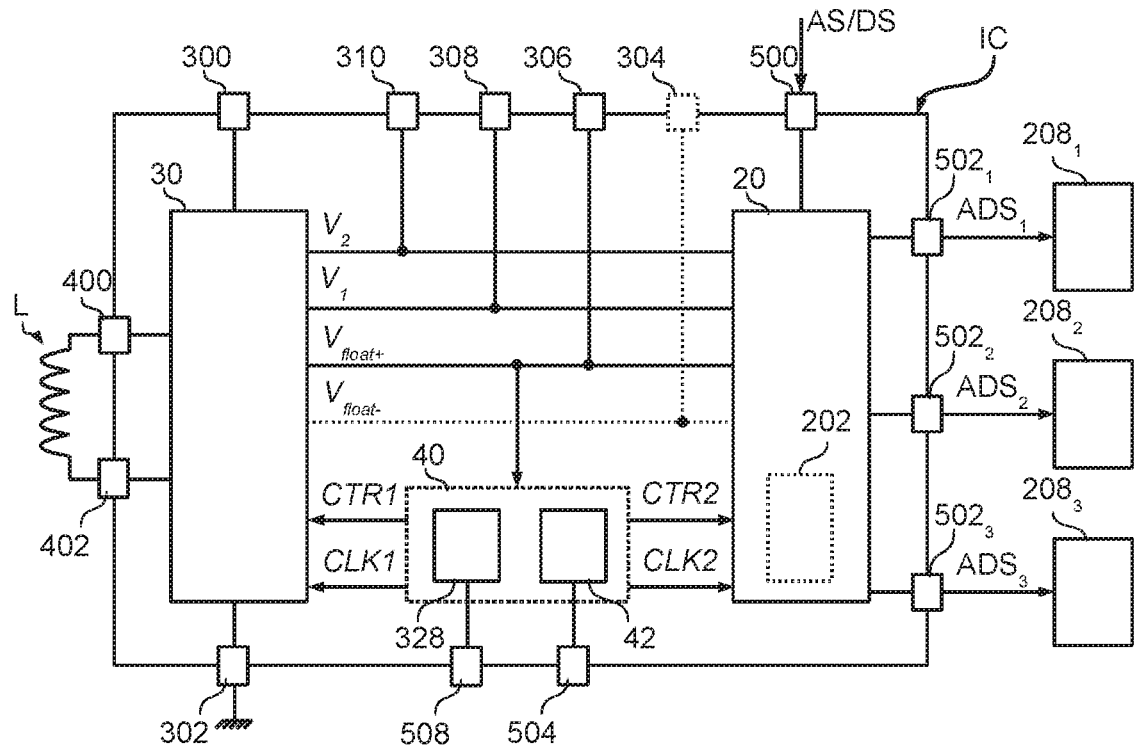

Accordingly, as shown in FIG. 26, in various embodiments the respective oscillator 328 shown in FIG. 22 may form part of this common control block 40. Generally, instead of using a complete oscillator, such as a ring oscillator or an integrated crystal oscillator, the oscillator circuit 236 may also comprise a circuit to be interfaced via a pad/pin 508 with an external oscillator, such as an external crystal oscillator, or directly with an external clock signal. For example, when receiving an external clock signal, e.g., together with digital sound data provide to the interface 506, the oscillator circuit 326 may comprise a Phase-Locked Loop (PLL), e.g., in order to generate the internal clock signals having a frequency being a multiple of the frequency of the externally received clock signal.

For example, the oscillator circuit 328 may generate a first clock signal CLK1, which is used by the control circuit 32 for generating the drive signals for the electronic switches. Similarly, the same oscillator circuit 328 may generate a second clock signal CLK2, which may be used by the audio amplifier, e.g., by the triangular waveform generator 202.

Accordingly, the frequency of the PWM signal DS (and thus the switching frequency of the half-bridges SW1/SW2 of the various channels of the audio amplifier 20) may be synchronized with the switching activity of the electronic converter 30. Generally, such a synchronization may be achieved by generating clock signals CLK1 and CLK2, where:

the frequency of the clock signal CLK1 corresponds to the frequency of the clock signal CLK2;

the frequency of the clock signal CLK1 corresponds to a multiple of the frequency of the clock signal CLK2; or the frequency of the clock signal CLK2 corresponds to a multiple of the frequency of the clock signal CLK1.

Thus, in various embodiments, the control circuit 32 of the electronic converter circuit drives the electronic switches Sh, Sl, Sbb, S+, S1 and S2 in response to the clock signal CLK1 and the PWM signal(s) DS are generated in response to the clock signal CLK2. Moreover, in various embodiments, the die of the integrated circuit IC comprises a control block 40 comprising an oscillator circuit 328 configured to generate the clock signals CLK1 and CLK2, whereby the switching activity of the electronic switches Sh, Sl, Sbb, S+, S1 and S2 is synchronized with the switching activity of the half-bridges of the amplifier stage 206.

Figure 27A:
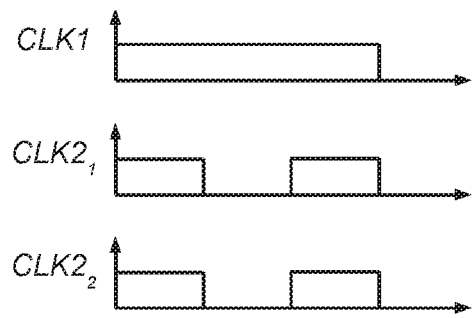
FIGS. 27A and 27B show exemplary waveforms of clock signals used in the integrated circuit of FIG. 26.

For example, FIG. 27A shows an embodiment, where the frequency of the clock signal CLK1 is half the frequency of the clock signals CLK2. Moreover, FIG. 27A shows that each channel of the audio amplifier 20 may operate with a respective clock signal CLK2. For example, in FIG. 27A are shown two clock signals $CLK2_1$ and $CLK2_2$. Preferably this clock signals $CLK2_1$ and $CLK2_2$ have the same frequency.

Accordingly, the synchronization permits to reduce or even avoid a negative effect of the switching activity of the electronic converter 30 on the amplified audio signals AAS. Specifically, by using synchronized clock signals, the frequency f1 of the clock signal CLK1 and the frequency f2 of the clock signal CLK2 have usually a difference Δ, which is greater than 20 kHz, i.e.:

$|f1-f2| \geq 20$ kHz.

Conversely, when the signals are not synchronized, it is likely that the amplified audio signal AAS may comprise harmonics of the clock signal CLK1, which may influence negatively the signal to noise ratio.

Moreover, in order to reduce electromagnetic interference (EMI), in various embodiments, the oscillator circuit 328 may also be configured to generate clock signals, where the frequencies f1 and f2 are not constant, but may vary over time, while still maintaining the clock signals synchronized.

However, the inventors have observed that the driving as shown in FIG. 27A may still generate undesired effects in the amplified audio signal AAS, in particular for low amplitude audio signals. Specifically, the switching of the channels of the electronic converter 30 and/or the audio amplifier 20 may cause a variation of the supply voltage of the half-bridge SW1/SW2 and/or one or more of the voltages provided by the electronic converter 30. Accordingly, generally, a mutual influence exists between the switching of the electronic converter 30 and the various channels of the audio amplifier 20. However, while the clock signals CLK1 and CLK2 ideally switch at the same instant, indeed the various channels and the electronic converter will switch at slightly different instances due to intrinsic jitter of the clock signals, whereby the various channels of the audio amplifier 20 may indeed switch with substantially different voltage levels during consecutive switching cycles.

Figure 27B:
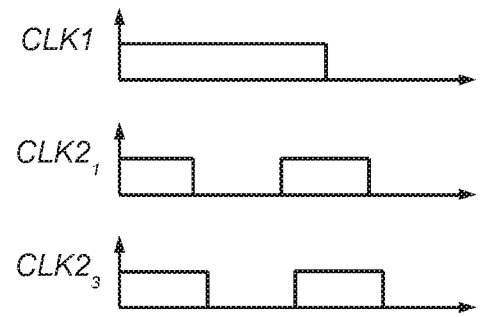

The inventors have observed that this mutual influence may be reduced by ensuring that, while the clock signals CLK1 and CLK2 are synchronized, these clock signals do not switch at the same instant. Accordingly, as shown in FIG. 27B, in various embodiments, a phase shift is introduced in the clock signals by the oscillator circuit 328, where preferably a different phase difference is used for each clock signal.

Accordingly, in the embodiment considered, the components for implementing both a SIMO converter 30 and a class-D audio amplifier 20 are implemented in a single integrated circuit IC. Specifically, only some external inductors and capacitors have to be connected to the integrated circuit IC and a single supply voltage $V_{bat}$ has to be provided at the pads/pins 300/302 of the integrated circuit IC in order to render the audio amplifier 20 operative. The integration of the various blocks in a common integrated circuit IC permits also to adapt the operation of the system in real time to different operation conditions, such as to variations of the supply voltage $V_{bus}$, the operation temperature of the system, the load connected to the output terminals 502, whether the audio amplifier indeed is used to amplify audio signals or is switched off, etc.

Figure 28:
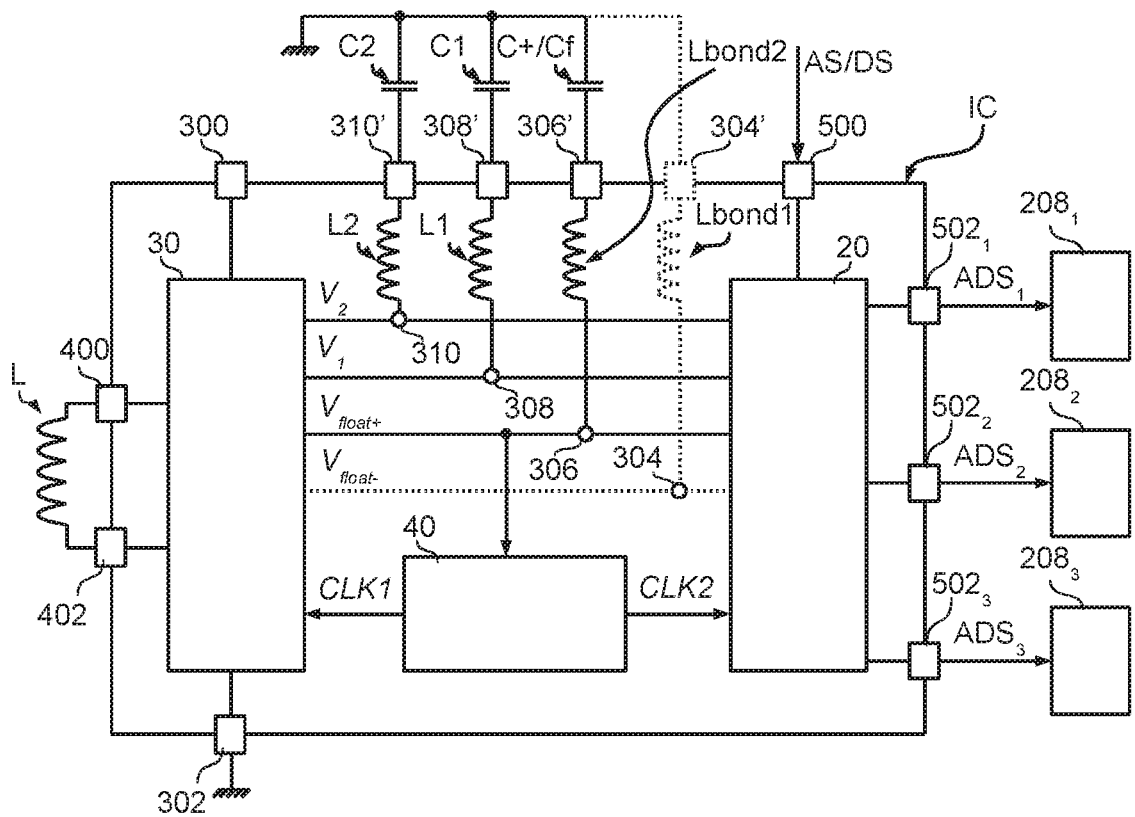
FIGS. 28, 29 and 30 show various embodiments of the connection of the pads of the die of the integrated circuits of FIGS. 24 to 26 to the pins of a respective package.

FIG. 28 shows a detailed view in case the integrated circuit IC comprises also a package. Specifically, in the embodiment considered, the pads 304, 306, 308 and 310 of the die are connected to respective pins 304', 306', 308' and 310' of the integrated circuit package via a respective wire bonding. For example, in FIG. 28 are shown in addition to the inductances Lbond1 and Lbond2 associated with the wiring of the pads 304 and 306 also inductances L1 and L2 for the pads 308 and 310. For example, typically such a wire bonding has an inductance between 1 and 10 nH, e.g., between 3 and 4 nH. In case the electronic converter 30 uses high switching frequencies, also high voltage pulses may be generated at these parasitic inductances, which thus may influence the performance of the system.

In line with the description of FIG. 23, this problem may be avoided or at least reduced, by interrupting the connection between the electronic converter 30 and the audio amplifier 20, and by using two wire bondings.

Figure 29:
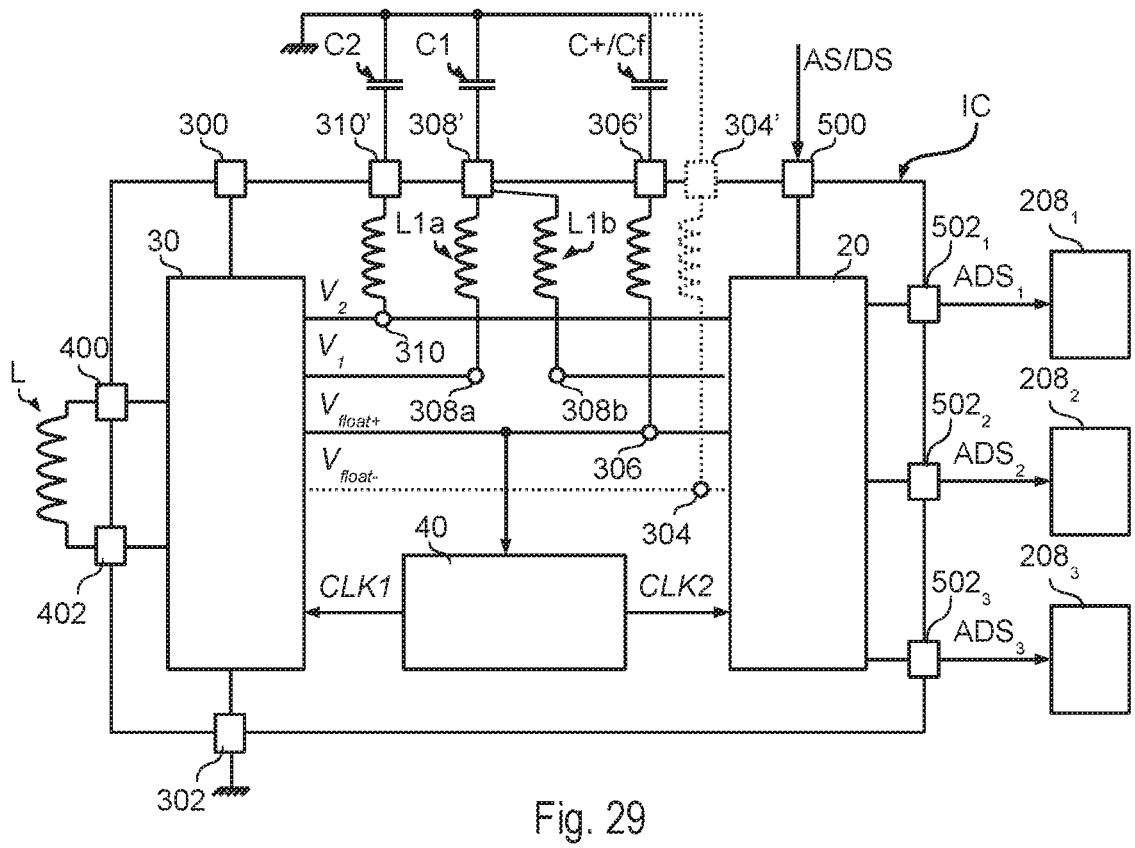

For example, FIG. 29 shows that at least one output terminal of the electronic converter 30, such as the terminal for the voltage $V_1$, is not connected directly to the audio amplifier 20 within the die of the integrated circuit IC. Specifically, the output terminal of the electronic converter 30 is connected to a first pad 308a of the die. Conversely, the respective input of the audio amplifier 20 configured to receive the voltage $V_1$ is connected to a second pad 308b of the die, i.e., the connection of the output terminal of the electronic converter 30 to the respective input terminal of the audio amplifier 20 is interrupted within the die of the integrated circuit IC.

In the embodiment shown in FIG. 29, the pads 308a and 308b are then connected via respective bondings to a common pin 308', i.e., the respective capacitor C1 has to be connected only to a single pin 308'.

Figure 30:
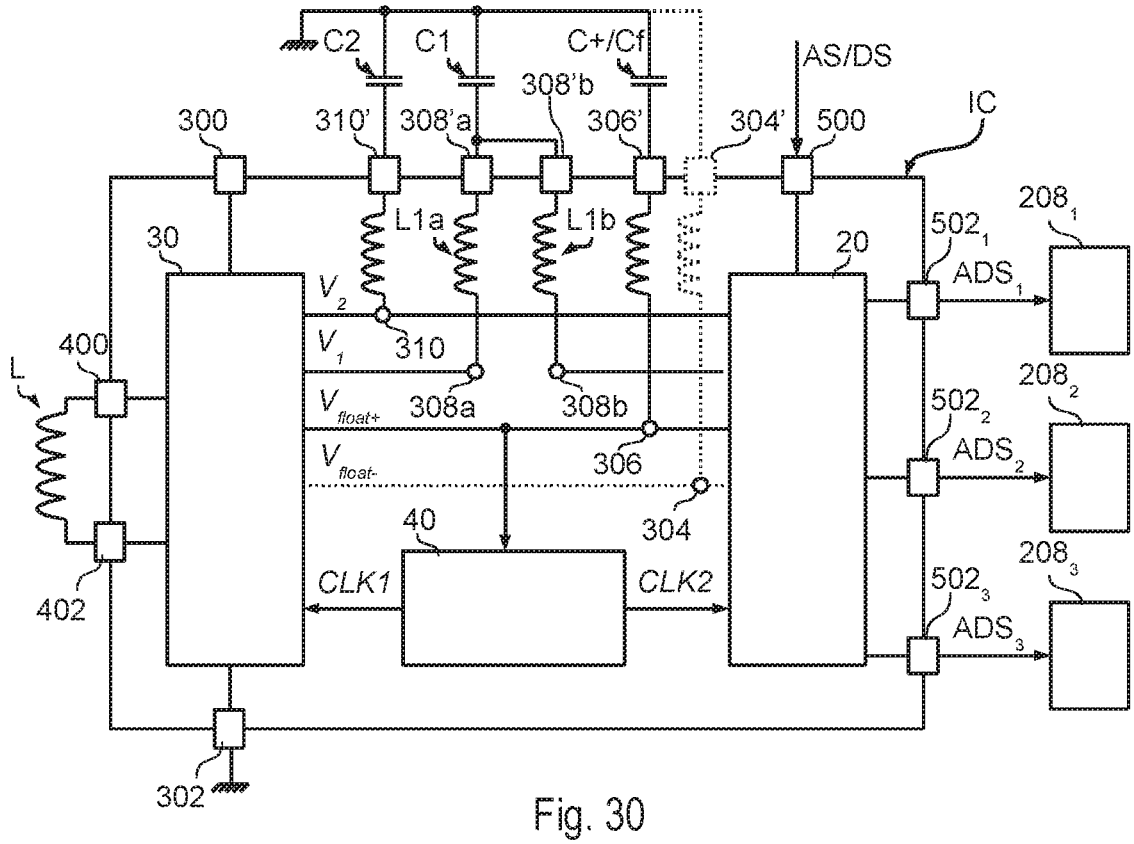

Conversely, in the embodiment shown in FIG. 30, the pads 308a and 308b are the connected via respective bondings to two separate pins 308'a and 308'b, i.e., the respective capacitor C1 has to be connected to both pins 308'a and 308'b, thereby short circuiting externally the pins 308'a and 308'b. In various embodiments, one or more pins of the IC may also be placed between the pins 308'a and 308'b, thereby further reducing the mutual inductance between the bondings of these pins. Generally, the external connection between the pins 308'a and 308'b may also be implemented with other means, such as traces on the printed circuit board.

Of course, without prejudice to the principle of the invention, the details of construction and the embodiments may vary widely with respect to what has been described and illustrated herein purely by way of example, without thereby departing from the scope of the present invention, as defined by the ensuing claims. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising a die, the die comprising:
    a first circuit configured to generate a pulse-width modulation (PWM) signal in response to a first clock signal;
    a first pad configured to provide an amplified PWM signal based on the PWM signal, wherein the first pad is configured to be coupled to an external low-pass or band-pass filter;
    an amplifier stage having an input configured to receive the PWM signal and an output configured to provide the amplified PWM signal, wherein the amplifier stage comprises:
        a half-bridge comprising a high-side switch and a low-side switch, wherein an intermediate node between the high-side switch and the low-side switch is coupled to the first pad,
        a high-side driver circuit configured to drive the high-side switch,
        a low-side driver circuit configured to drive the low-side switch, and
        a first control circuit configured to generate control signals for the high-side driver circuit and the low-side driver circuit as a function of the PWM signal;
    two power supply pads configured to receive a supply voltage, the power supply pads comprising a positive pad and a negative pad;
    two pads configured to be coupled to an external inductor;
    a second set of pads, wherein each respective pad of the second set of pads is configured to provide a respective regulated voltage of regulated voltages, wherein each pad of the second set of pads is configured to be coupled to a respective external capacitor of a plurality of external capacitors;
    an electronic converter circuit configured to generate the regulated voltages in order to supply the high-side driver circuit, the low-side driver circuit and the first control circuit, wherein the electronic converter circuit comprises:
        a respective output terminal of a plurality of output terminals coupled to a respective pad of the second set of pads for each of the regulated voltages,
        a first set of electronic switches configured to selectively couple the two pads to the two power supply pads for controlling a current flowing through the external inductor,
        a second set of electronic switches configured to sequentially couple the two pads to the plurality of output terminals to charge the plurality of external capacitors with the current flowing through the external inductor, and
        a second control circuit configured to drive the first set of electronic switches and the second set of electronic switches in response to a second clock signal in order to regulate each of the regulated voltages to a respective target value; and
    a control block comprising an oscillator circuit configured to generate the first clock signal and the second clock signal to synchronize a switching activity of the first set of electronic switches and the second set of electronic switches with a switching activity of the half-bridge of the amplifier stage.

2. The integrated circuit of claim 1, wherein the oscillator circuit is configured to generate the first clock signal and the second clock signal such that:
    a frequency of the second clock signal corresponds to a frequency of the first clock signal;
    the frequency of the second clock signal corresponds to a multiple of the frequency of the first clock signal; or
    the frequency of the first clock signal corresponds to a multiple of the frequency of the second clock signal.

3. The integrated circuit of claim 1, wherein the oscillator circuit comprises an integrated oscillator or a phase-locked loop (PLL).

4. The integrated circuit of claim 1, wherein the first circuit comprises:
    a terminal for receiving an analog audio signal, a triangular waveform generator configured to generate a triangular waveform signal in response to a respective first clock signal, and a comparator configured to generate the PWM signal by comparing the analog audio signal with the triangular waveform signal;
    a signal generator configured to generate the analog audio signal or the PWM signal; or
    a second pad and a communication interface configured to receive digital audio data, and a processing circuit configured to convert the digital audio data into the analog audio signal or the PWM signal.

5. The integrated circuit of claim 1, wherein:
    a first voltage of the regulated voltages is referred to the negative pad of the two power supply pads, wherein a third pad of the second set of pads is configured to be coupled via the respective external capacitor to the negative pad of the two power supply pads, the third pad configured to carry the first voltage; and
    the die further comprises a further pad, wherein the electronic converter circuit is configured to generate a further voltage at the further pad, wherein a second voltage of the regulated voltages is referred to the further voltage, wherein a fourth pad of the second set of pads is configured to be coupled via the respective external capacitor to the further pad, the fourth pad configured to carry the second voltage.

6. The integrated circuit of claim 5, wherein the second voltage is used to supply the first control circuit of the amplifier stage.

7. The integrated circuit of claim 5, wherein the high-side switch and the low-side switch of the half-bridge are coupled between the two power supply pads, and wherein the electronic converter circuit is configured to regulate the further voltage to a value determined as a function of the value of the supply voltage.

8. The integrated circuit of claim 5, wherein:
the first set of electronic switches comprises a first electronic switch coupled between the positive pad and a first pad of the two pads, and a second electronic switch coupled between a second pad of the two pads and the negative pad;
the second set of electronic switches comprises a third electronic switch coupled between the second pad of the two pads and the fourth pad, and a fourth electronic switch coupled between the first pad of the two pads and the further pad; and
the second control circuit is configured to:
monitor the voltage between the fourth pad and the further pad,
during a charge phase, close the first and second electronic switches to increase a current flowing through the external inductor,
during a discharge phase, close the third and the fourth electronic switches to charge the respective external capacitor coupled between the fourth pad and the further pad with the current to increase a first regulated voltage of the regulated voltages between the fourth pad and the further pad, and
regulate a duration of the charge phase or discharge phase such that the first regulated voltage corresponds to the respective target value.

9. The integrated circuit of claim 1, wherein the die further comprises a first communication pad, and wherein the control block comprises a first communication interface coupled to the first communication pad for:
receiving control commands for controlling an operation of the electronic converter circuit or the amplifier stage; or
transmitting information concerning a status of the electronic converter circuit or the amplifier stage.

10. The integrated circuit of claim 1, wherein the integrated circuit comprises a package comprising a plurality of pins, wherein each pin of the plurality of pins is coupled to a respective pad of the second set of pads, wherein each of the plurality of pins is associated univocally to a respective regulated voltage of the regulated voltages;
wherein the amplifier stage comprises for each of the regulated voltages a respective input terminal of a plurality of input terminals, wherein a first input terminal of the plurality of input terminals is not connected within the die to the respective output terminal of the electronic converter circuit, and wherein the first input terminal of the amplifier stage is coupled to a further pad of the die; and
wherein the further pad is coupled via a wire bonding to a first pin of the plurality of pins being associated with the respective regulated voltage, or
the further pad is coupled via a wire bonding to a further pin, the further pin being configured to be coupled externally to a second pin of the plurality of pins being associated with the respective regulated voltage.

11. An integrated circuit comprising a die, the die comprising:

a first circuit configured to generate a plurality of pulse-width modulation (PWM) signals in response to a first clock signal;
a first plurality of pads configured to provide a plurality of amplified PWM signal based on the plurality of PWM signals, wherein each of the first plurality of pads is configured to be coupled to a respective external low-pass or band-pass filter;
an amplifier stage having inputs configured to receive the plurality of PWM signals and outputs configured to provide the plurality of amplified PWM signals, wherein the amplifier stage comprises:
a plurality of half-bridges, each half-bridge of the plurality of half-bridges comprising:
a respective high-side switch,
a respective low-side switch, and
a respective output node coupled to a respective pad of the first plurality of pads,
a plurality of high-side driver circuits and low-side driver circuits configured to drive the plurality of half-bridges, and
a plurality of first control circuits configured to generate control signals for the plurality of high-side driver circuits and low-side driver circuits as a function of the plurality of PWM signals;
two power supply pads configured to receive a supply voltage, the power supply pads comprising a positive pad and a negative pad;
two pads configured to be coupled to an external inductor of a plurality of external capacitors;
a second plurality of pads, wherein each respective pad of the second plurality of pads is configured to provide a respective regulated voltage of regulated voltages, wherein each pad of the second plurality of pads is configured to be coupled to a respective external capacitor;
an electronic converter circuit configured to generate the regulated voltages in order to supply the plurality of high-side driver circuits, the plurality of low-side driver circuits and the plurality of first control circuits, wherein the electronic converter circuit comprises:
a respective output terminal of a plurality of output terminals coupled to a respective pad of the second plurality of pads for each of the regulated voltages,
a first set of electronic switches configured to selectively couple the two pads to the two power supply pads for controlling a current flowing through the external inductor,
a second set of electronic switches configured to sequentially couple the two pads to the plurality of output terminals to charge the plurality of external capacitors with the current flowing through the external inductor, and
a second control circuit configured to drive the first set of electronic switches and the second set of electronic switches in response to a second clock signal in order to regulate each of the regulated voltages to a respective target value; and
a control block comprising an oscillator circuit configured to generate the first clock signal and the second clock signal to synchronize a switching activity of the first set of electronic switches and the second set of electronic switches with a switching activity of the plurality of half-bridges of the amplifier stage.

12. The integrated circuit of claim 11, wherein the oscillator circuit is configured to generate the first clock signal and the second clock signal such that:

a frequency of the second clock signal corresponds to a frequency of the first clock signal;
the frequency of the second clock signal corresponds to a multiple of the frequency of the first clock signal; or
the frequency of the first clock signal corresponds to a multiple of the frequency of the second clock signal.

13. The integrated circuit of claim 12, wherein the first circuit is configured to generate each of the plurality of PWM signals in response to a respective first clock signal, and wherein the oscillator circuit is configured to apply a different phase difference to each of the respective first clock signal and the second clock signal.

14. The integrated circuit of claim 11, wherein the oscillator circuit comprises an integrated oscillator or a phase-locked loop (PLL).

15. The integrated circuit of claim 11, wherein the first circuit comprises:
for each respective PWM signal of the plurality of PWM signals, a respective terminal for receiving an analog audio signal, a triangular waveform generator configured to generate a triangular waveform signal in response to a respective first clock signal, and a comparator configured to generate the respective PWM signal by comparing the analog audio signal with the triangular waveform signal;
a signal generator configured to generate the analog audio signal; or
a first pad and a communication interface configured to receive digital audio data, and a processing circuit configured to convert the digital audio data into the analog audio signal.

16. The integrated circuit of claim 11, wherein:
a first voltage of the regulated voltages is referred to the negative pad of the two power supply pads, wherein a third pad of the second plurality of pads is configured to be coupled via the respective external capacitor to the negative pad of the two power supply pads, the third pad configured to carry the first voltage; and
the die further comprises a further pad, wherein the electronic converter circuit is configured to generate a further voltage at the further pad, wherein a second voltage of the regulated voltages is referred to the further voltage, wherein a fourth pad of the second plurality of pads is configured to be coupled via the respective external capacitor to the further pad, the fourth pad configured to carry the second voltage.

17. The integrated circuit of claim 16, wherein the second voltage is used to supply the first control circuits of the amplifier stage.

18. The integrated circuit of claim 16, wherein each half-bridge of the plurality of half-bridges is coupled between the two power supply pads, and wherein the electronic converter circuit is configured to regulate the further voltage to a value determined as a function of the value of the supply voltage.

19. The integrated circuit of claim 16, wherein:
the first set of electronic switches comprises a first electronic switch coupled between the positive pad and a first pad of the two pads, and a second electronic switch coupled between a second pad of the two pads and the negative pad;
the second set of electronic switches comprises a third electronic switch coupled between the second pad of the two pads and the fourth pad, and a fourth electronic switch coupled between the first pad of the two pads and the further pad; and
the second control circuit is configured to:
monitor the voltage between the fourth pad and the further pad,
during a charge phase, close the first and second electronic switches to increase a current flowing through the external inductor,
during a discharge phase, close the third and the fourth electronic switches to charge the respective external capacitor coupled between the fourth pad and the further pad with the current to increase a first regulated voltage of the regulated voltages between the fourth pad and the further pad, and
regulate a duration of the charge phase or discharge phase such that the first regulated voltage corresponds to the respective target value.

20. An audio amplifier comprising:
an integrated circuit comprising a die, the die comprising:
a first circuit configured to generate a plurality of pulse-width modulation (PWM) signals in response to a first clock signal;
a first plurality of pads configured to provide a plurality of amplified PWM signal based on the plurality of PWM signals, wherein each of the first plurality of pads is configured to be coupled to a respective external low-pass or band-pass filter;
an amplifier stage having inputs configured to receive the plurality of PWM signals and outputs configured to provide the plurality of amplified PWM signals, wherein the amplifier stage comprises:
a plurality of half-bridges, each half-bridge of the plurality of half-bridges comprising:
a respective high-side switch,
a respective low-side switch, and
a respective output node coupled to a respective pad of the first plurality of pads,
a plurality of high-side driver circuits and low-side driver circuits configured to drive the plurality of half-bridges, and
a plurality of first control circuits configured to generate control signals for the plurality of high-side driver circuits and low-side driver circuits as a function of the plurality of PWM signals;
two power supply pads configured to receive a supply voltage, the power supply pads comprising a positive pad and a negative pad;
two pads configured to be coupled to an external inductor of a plurality of external capacitors;
a second plurality of pads, wherein each respective pad of the second plurality of pads is configured to provide a respective regulated voltage of regulated voltages, wherein each pad of the second plurality of pads is configured to be coupled to a respective external capacitor;
an electronic converter circuit configured to generate the regulated voltages in order to supply the plurality of high-side driver circuits, the plurality of low-side driver circuits and the plurality of first control circuits, wherein the electronic converter circuit comprises:
a respective output terminal of a plurality of output terminals coupled to a respective pad of the second plurality of pads for each of the regulated voltages,
a first set of electronic switches configured to selectively couple the two pads to the two power supply pads for controlling a current flowing through the external inductor, a second set of electronic switches configured to sequentially couple the two pads to the plurality of output terminals to charge the plurality of external capacitors with the current flowing through the external inductor, and a second control circuit configured to drive the first set of electronic switches and the second set of electronic switches in response to a second clock signal in order to regulate each of the regulated voltages to a respective target value; and a control block comprising an oscillator circuit configured to generate the first clock signal and the second clock signal to synchronize a switching activity of the first set of electronic switches and the second set of electronic switches with a switching activity of the plurality of half-bridges of the amplifier stage;

a plurality of low-pass or band-pass filters coupled to the first plurality of pads of the integrated circuit;

the external inductor coupled to the two pads of the integrated circuit; and the plurality of external capacitors coupled to the second plurality of pads of the integrated circuit.

* * * * *